(12) United States Patent
Hong et al.

(10) Patent No.: US 11,695,046 B2
(45) Date of Patent: Jul. 4, 2023

(54) SEMICONDUCTOR DEVICE WITH REDUCED CONTACT RESISTANCE

(71) Applicant: SAMSUNG ELECTRONICS CO., LTD., Suwon-si (KR)

(72) Inventors: Sahwan Hong, Yongin-si (KR); Hanki Lee, Hwaseong-si (KR); Jeongmin Lee, Gyeongju-si (KR)

(73) Assignee: Samsung Electronics Co., Ltd.

( * ) Notice: Subject to any disclaimer, the term of this patent is extended or adjusted under 35 U.S.C. 154(b) by 15 days.

(21) Appl. No.: 17/370,551

(22) Filed: Jul. 8, 2021

(65) Prior Publication Data

US 2022/0181446 A1 Jun. 9, 2022

(30) Foreign Application Priority Data

Dec. 7, 2020 (KR) ......................... 10-2020-0169762

(51) Int. Cl.
*H01L 29/167* (2006.01)
*H01L 29/08* (2006.01)
*H01L 29/417* (2006.01)
*H01L 21/02* (2006.01)
*H01L 29/06* (2006.01)
(Continued)

(52) U.S. Cl.
CPC ........ *H01L 29/167* (2013.01); *H01L 29/0847* (2013.01); *H01L 29/41775* (2013.01)

(58) Field of Classification Search
CPC ............................. H01L 29/0843–0891; H01L 29/66636–66643; H01L 21/823418–823425; H01L 21/823814; H01L 21/823412; H01L 21/823807; H01L 29/66492; H01L 29/7833–7836; H01L 29/78621; H01L 29/66575–66598; H01L 29/66515; H01L 29/66537; H01L 29/41783; H01L 29/41791; H01L 2029/7858; H01L 29/167; H01L 29/41775; H01L 29/41766; H01L 29/165; H01L 29/7848; H01L 21/02532; H01L 29/7845; H01L 29/785; H01L 29/0847; H01L 21/823431; H01L 29/66795; H01L 21/76843; H01L 21/28518; H01L 29/665

See application file for complete search history.

(56) References Cited

U.S. PATENT DOCUMENTS 6,706,614 B1 3/2004 An et al.
7,750,353 B2 7/2010 Lee et al.
(Continued)

FOREIGN PATENT DOCUMENTS

JP 2018029128 A 2/2018

*Primary Examiner* — Sonya McCall-Shepard
(74) *Attorney, Agent, or Firm* — Myers Bigel, P.A.

(57) ABSTRACT

A semiconductor device includes an active region on a substrate, a gate structure on the substrate and intersecting the active region, a source/drain region on the active region on both sides of the gate structure and including silicon (Si), and a contact structure on the source/drain region. The source/drain region includes a shallow doping region doped with germanium (Ge) and is in an upper region including an upper surface of the source/drain region. A concentration of germanium (Ge) in the shallow doping region gradually decreases from the upper surface of the source/drain region toward an upper surface of the substrate in a direction that is perpendicular to an upper surface of the substrate.

20 Claims, 23 Drawing Sheets

(51) Int. Cl.
  *H01L 29/165* (2006.01)
  *H01L 29/423* (2006.01)
  *H01L 29/66* (2006.01)
  *H01L 29/78* (2006.01)
  *H01L 29/786* (2006.01)
  *H01L 29/775* (2006.01)
  *B82Y 10/00* (2011.01)
  *H01L 21/8234* (2006.01)

(56) References Cited

U.S. PATENT DOCUMENTS

| | | |
|---|---|---|
| 7,816,236 B2 | 10/2010 | Bauer et al. |
| 8,652,951 B2 | 2/2014 | Huang et al. |
| 9,082,684 B2 | 7/2015 | Sanchez et al. |
| 2008/0135890 A1 | 6/2008 | Nakagawa et al. |
| 2008/0220606 A1 | 9/2008 | Cabral et al. |
| 2020/0006160 A1* | 1/2020 | Lin .................. H01L 21/823871 |
| 2020/0006545 A1* | 1/2020 | Liu ................... H01L 29/66795 |

* cited by examiner

SEMICONDUCTOR DEVICE WITH REDUCED CONTACT RESISTANCE

CROSS-REFERENCE TO RELATED APPLICATION(S)

This application claims benefit of priority to Korean Patent Application No. 10-2020-0169762 filed on Dec. 7, 2020 in the Korean Intellectual Property Office, the disclosure of which is incorporated herein by reference in its entirety.

BACKGROUND

The present inventive concept relates to a semiconductor device.

As demands for high performance, high speed and/or multi functionality in semiconductor devices increase, the degree of integration of semiconductor devices is increasing. In accordance with the trend for higher integration of semiconductor devices, a size of a planar MOSFET may be decreasing. In order to overcome the limitation of operating characteristics due to the decrease in size of a MOSFET, efforts for developing an MOSFET having a three-dimensional structure have been made. When forming a transistor semiconductor device, it is desirable to lower contact resistance with a contact structure.

SUMMARY

An aspect of the present inventive concept is to provide a semiconductor device having improved electrical characteristics.

According some embodiments of the present inventive concept, a semiconductor device includes an active region on a substrate, a gate structure on the substrate and intersecting the active region, a source/drain region on the active region and on a side of the gate structure and including silicon (Si), and a contact structure on the source/drain region. The source/drain region includes a shallow doping region that is doped with germanium (Ge) and is in an upper region including an upper surface of the source/drain region. A concentration of germanium (Ge) in the shallow doping region gradually decreases from the upper surface of the source/drain region toward an upper surface of the substrate in a direction that is perpendicular to an upper surface of the substrate.

According to some embodiments of the present inventive concept, a semiconductor device includes an active region on a substrate and extending in a first direction, a gate structure on the substrate, intersecting the active region, and extending in a second direction, and a source/drain region on the active region and on a side of the gate structure and including silicon (Si). The source/drain region includes a shallow doping region doped with germanium (Ge) and in an upper region including an upper surface of the source/drain region, and an epitaxial region below the shallow doping region, wherein a thickness of the epitaxial region in a third direction that is perpendicular to an upper surface of the substrate, is greater than a thickness of the shallow doping region in the third direction, and an atomic percentage of germanium (Ge) with respect to silicon (Si) on the upper surface of the source/drain region is within a range of about 95 at % to about 100 at %.

According to some embodiments of the present inventive concept, a semiconductor device includes an active region on a substrate, a gate structure on the substrate and intersecting the active region, and a source/drain region on the active region on at least one side of the gate structure. The source/drain region includes a first region having a depth of about 2 nm to about 6 nm from an upper surface of the source/drain region. In the first region, a concentration of germanium (Ge) in the source/drain region gradually decreases as a depth of the source/drain region from the upper surface of the source/drain region increases.

According to some embodiments of the present inventive concept, a method of preparing a semiconductor device includes providing a substrate, forming a source/drain region on the substrate by epitaxial growth, and doping germanium (Ge) on an upper surface of the source/drain region to gradually decrease a concentration of germanium (Ge), from the upper surface of the source/drain region in a direction that is perpendicular to an upper surface of the substrate. The doping germanium (Ge) includes performing a hydrogen treatment on the upper surface of the source/drain region, diffusing germanium (Ge) on the hydrogen-treated upper surface of the source/drain region to dope germanium (Ge) on the hydrogen-treated upper surface of the source/drain region, and selectively removing germanium (Ge) remaining in regions, other than the source/drain region.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred embodiments of the present inventive concept will be described with reference to the accompanying drawings.

Figure 1:
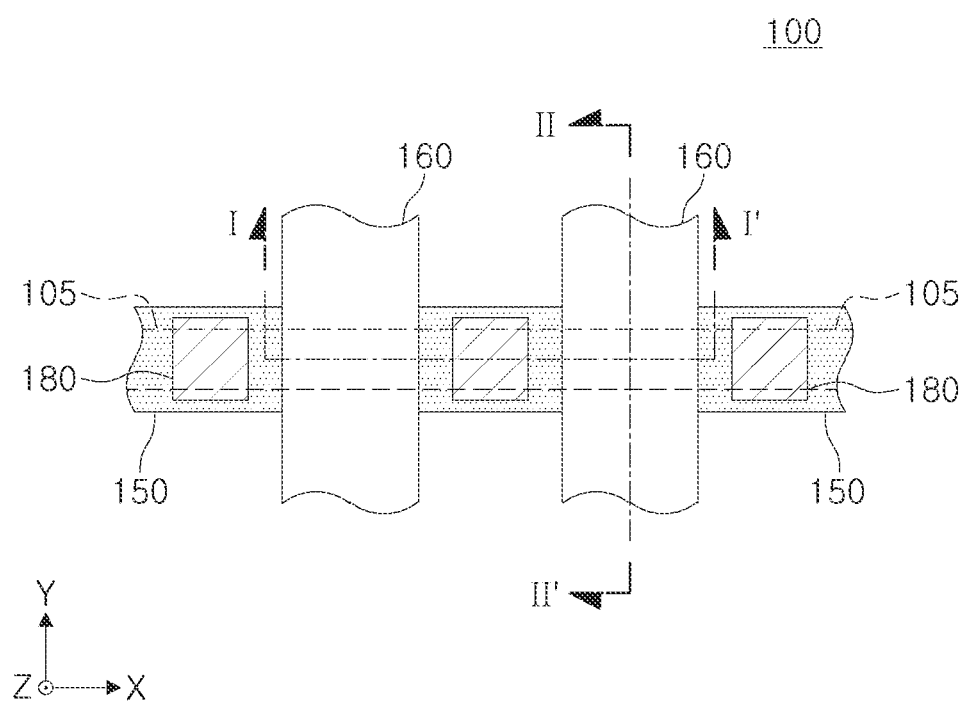
FIG. 1 is a plan view schematically illustrating a semiconductor device according to some embodiments.
Figure 2A:
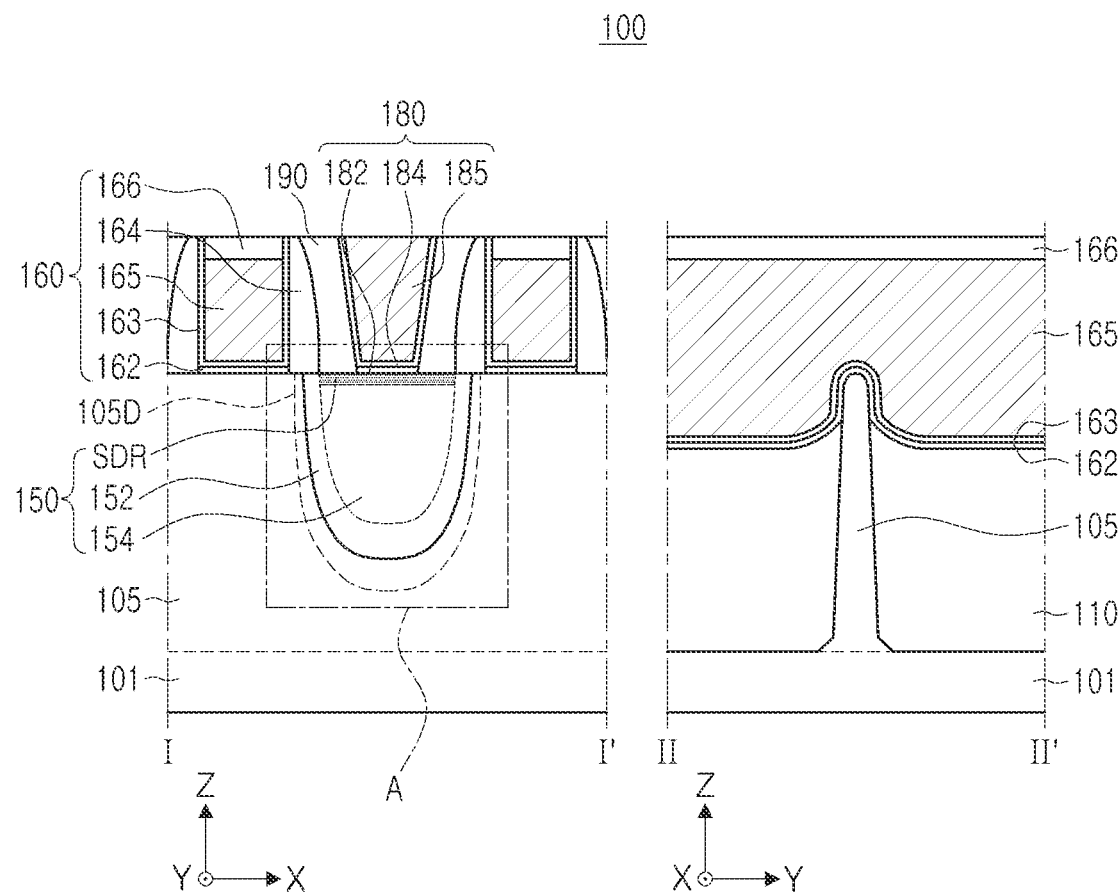
FIG. 2A is a cross-sectional view schematically illustrating a semiconductor device according to some embodiments.
Figure 2B:
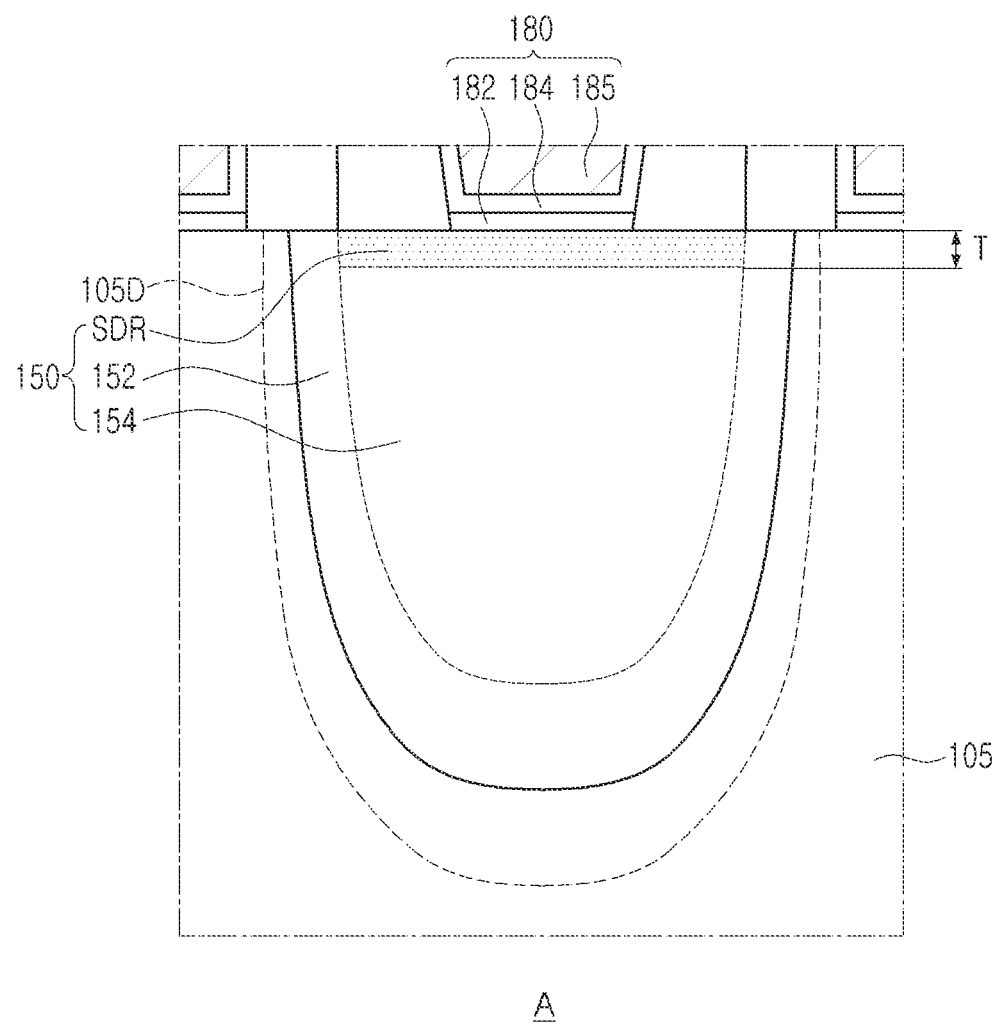
FIG. 2B is a partially enlarged view schematically illustrating a semiconductor device according to some embodiments.

FIG. 1 is a plan view schematically illustrating a semiconductor device according to some embodiments. FIG. 2A is a cross-sectional view schematically illustrating a semiconductor device according to some embodiments. FIG. 2A is a cross-sectional view of the semiconductor device of FIG. 1, taken along lines I-I' and FIG. 2B is a partially enlarged view schematically illustrating a semiconductor device according to some embodiments. FIG. 2B may be a cross-sectional view schematically illustrating an enlarged portion "A" of FIG. 2A. For convenience of explanation, only major components of a semiconductor device are illustrated in FIGS. 1 to 2B.

Referring to FIGS. 1 to 2B, a semiconductor device 100 may include a substrate 101, an active region 105, a device isolation layer 110, a source/drain region 150, a gate structure 160, a contact structure 180, and an interlayer insulating layer 190. The semiconductor device 100 may include FinFET devices, a transistor in which the active region 105 has a fin structure, but is not limited thereto, and may include, for example, a planar transistor. The FinFET devices may include transistors disposed around an active region 105 and a gate structure 160, intersecting each other. For example, the transistors may be PMOS transistors.

The substrate 101 may have an upper surface extending in X and Y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial region, a silicon-on-insulator (SOI) layer, a semiconductor-on-insulator (SeOI) layer, or the like.

The device isolation layer 110 may define the active region 105 in the substrate 101. The device isolation layer 110 may be formed by, for example, a shallow trench isolation (STI) process. According to some embodiments, the device isolation layer 110 may include a region extending deeper into a lower portion of the substrate 101. The device isolation layer 110 may have an upper surface having a curved shape with higher level closer to the active region 105, but a shape of the upper surface of the device isolation layer 110 is not limited thereto. The device isolation layer 110 may be formed of an insulating material. The device isolation layer 110 may be, for example, an oxide, a nitride, or a combination thereof.

The active region 105 may be defined by the device isolation layer 110 in the substrate 101, and may be disposed to extend in a first direction, for example, the X direction. The active region 105 may have a structure protruding from the substrate 101. An upper end of the active region 105 may be disposed to protrude from the upper surface of the device isolation layer 110 to a predetermined height level. The active region 105 may be formed of a portion of the substrate 101 or may include an epitaxial region grown from the substrate 101. On both sides of the gate structure 160, the active region 105 on the substrate 101 may be partially recessed, and the source/drain region 150 may be disposed on the recessed active region 105.

The active region 105 may have a doped region 105D including impurities. The doped region 105D may be disposed outside a recessed active region in which the source/drain region 150 is disposed, to contact the source/drain region 150. The doped region 105D may include impurities of the same conductivity type as the source/drain region 150 at a lower concentration than the source/drain region 150. According to the described method, the doped region 105D may be interpreted as a portion of the source/drain region 150. For example, the doped region 105D may include first impurities. The first impurities may be, for example, at least one of boron (B), aluminum (Al), gallium (Ga), or indium (In). The doped regions 105D contacting one (1) source/drain region 150 may be spaced apart from each other in one direction, for example, in the X direction, and may be located on both sidewalls of the source/drain region 150. According to some embodiments, the doped region 105D may be omitted.

The source/drain region 150 may be disposed on both sides of the gate structure 160 and on a recessed region in which the active region 105 is recessed. The recessed region may extend in the X direction between the gate structures 160, and may have inner walls located at both ends in the X direction, and a bottom surface between the inner walls. The source/drain region 150 may be provided as a source region or a drain region of a transistor. An upper surface of the source/drain region 150 may be located on the same level as a lower surface of the gate structure 160, as illustrated in FIG. 2A. A relative height between the source/drain region 150 and the gate structure 160 may be variously changed according to some embodiments.

The source/drain region 150 may have a pentagonal shape, a hexagonal shape, or a similar shape in a cross-sectional view in the Y direction. In example embodiments, the source/drain region 150 may have various shapes, for example, may have any one of a polygonal shape, a circular shape, or a rectangular shape. In addition, the source/drain region 150 may have an upper surface having a planar shape in a cross-sectional view in the X direction, as illustrated in FIG. 2A, or may have a curved shape such as a portion of a circular shape, a portion of an elliptical shape, or a similar shape, below the upper surface. Such a shape may be variously changed in embodiments according to a distance between adjacent gate structures 160, a height of the active region 105, or the like.

The source/drain region 150 may include a shallow doping region SDR and epitaxial regions 152 and 154 disposed below the shallow doping region SDR. In some example embodiments, the epitaxial regions 152 and 154 may include a first epitaxial region 152 and a second epitaxial region 154 disposed on the first epitaxial region 152. The source/drain region 150 may include a first epitaxial region 152, a second epitaxial region 154 disposed on the first epitaxial region 152, and a shallow doping region SDR disposed on the second epitaxial region 154.

Each of the first epitaxial region 152, the second epitaxial region 154, and the shallow doping region SDR may include silicon (Si) and germanium (Ge), and may include elements and/or impurities having different concentrations. In example embodiments, the number of epitaxial regions constituting the source/drain region 150 may be variously changed.

The source/drain region 150 may have a first conductivity type, for example, a P-type conductivity. In example embodiments, the source/drain region 150 may include first impurities, identical to the doped region 105D, for example, boron (B).

The shallow doping region SDR may be disposed in an upper region including the upper surface of the source/drain region 150. In example embodiments, the upper surface of the upper surface of the source/drain region 150 may include an upper end of the shallow doping region SDR. In this specification, the upper end of the shallow doping region may be defined as a set of points in which a concentration of germanium (Ge) has a maximum value in the shallow doping region SDR or in which a concentration of germanium (Ge) is greater than adjacent the lower end of the shallow doping region.

Figure 14A:
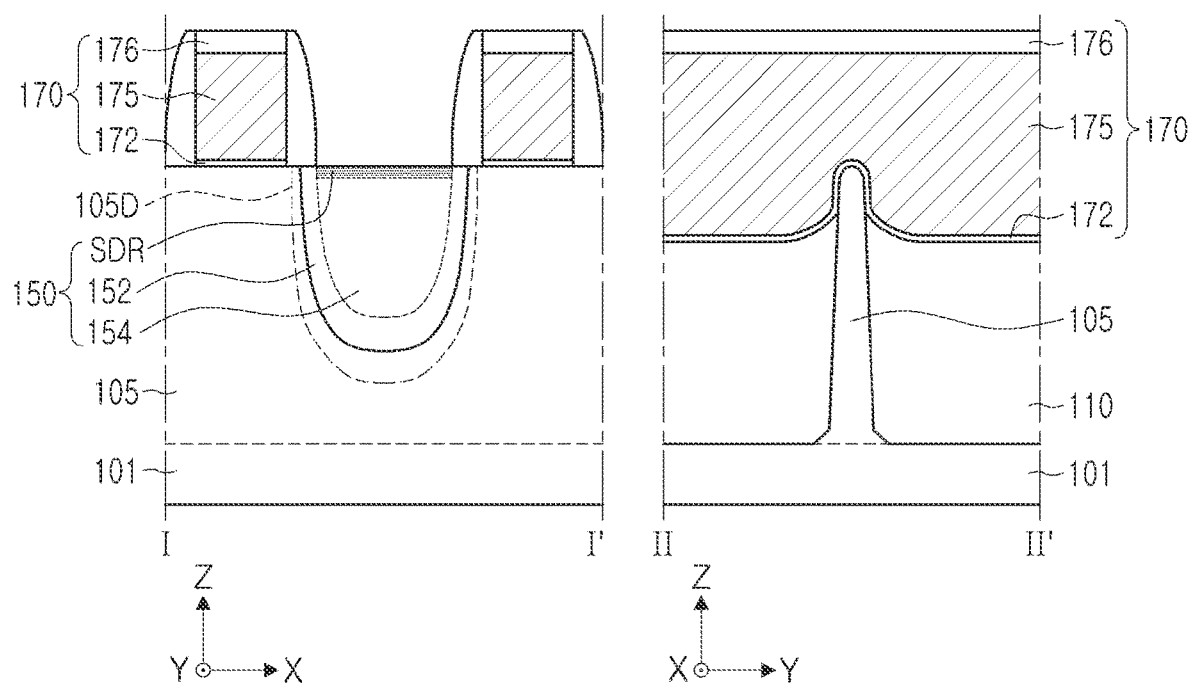
FIGS. 14A to 14C are views illustrating a method of manufacturing a semiconductor device according to example embodiments.
Figure 14B:
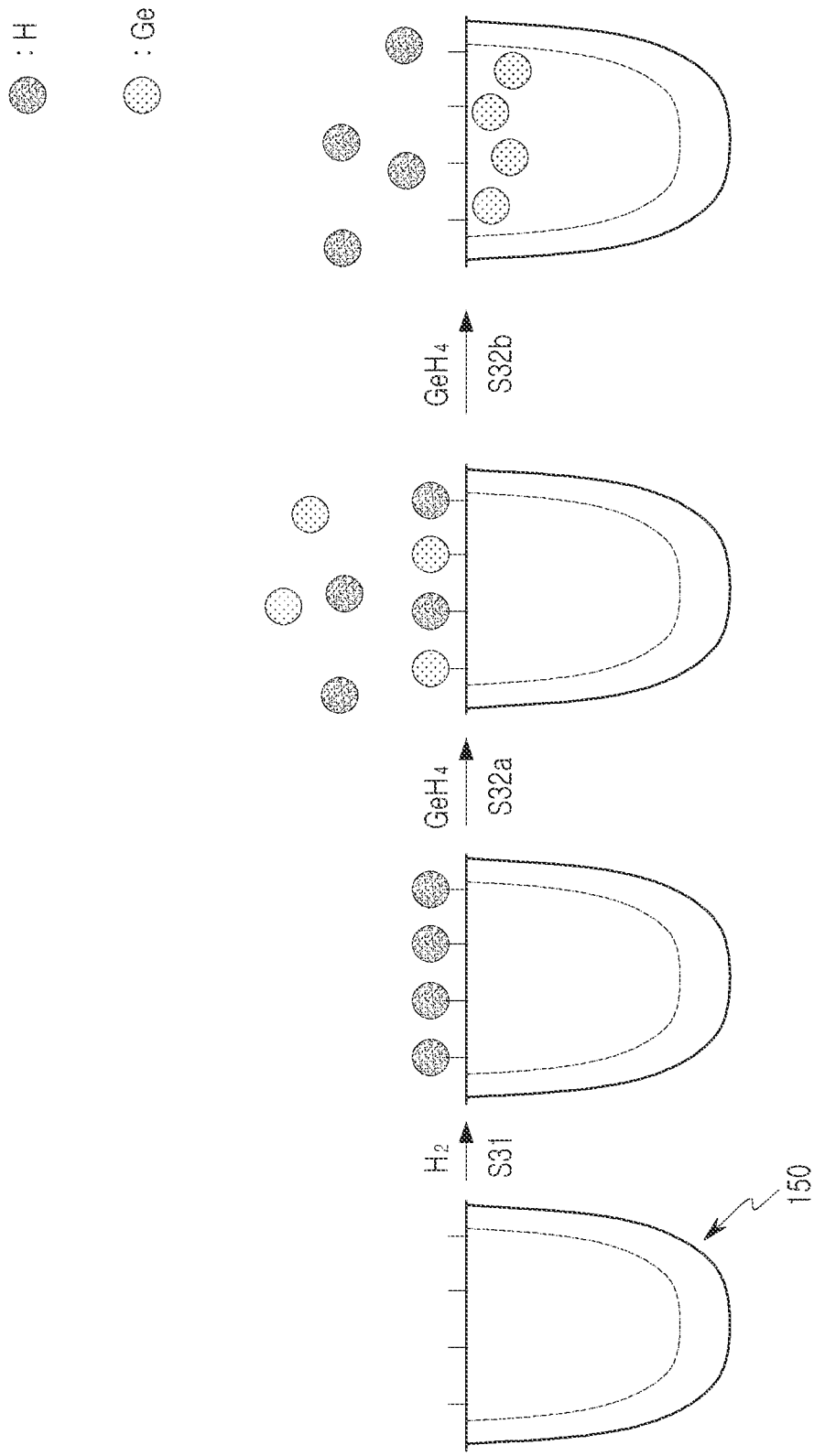
Figure 14C:
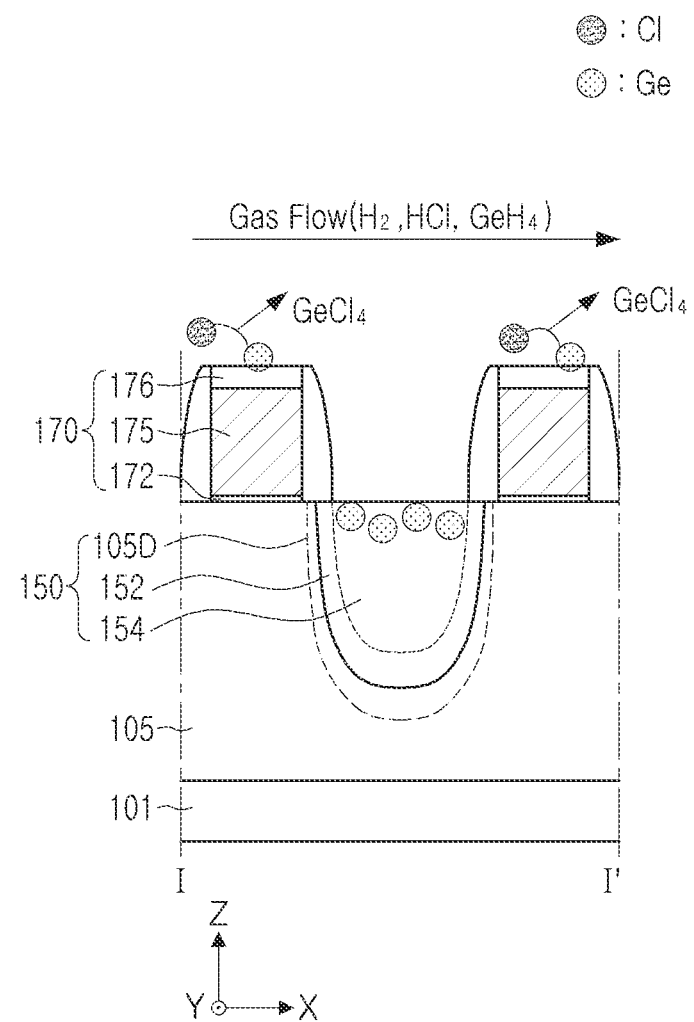

The shallow doping region SDR may be a region doped with germanium (Ge) on the upper surface of the source/drain region 150 by a doping process described in FIGS. 14A to 14C. Germanium (Ge) may be diffused from the upper surface of the source/drain region 150 in an interstitial manner to be disposed in the shallow doping region SDR. A concentration of germanium (Ge) in the shallow doping region SDR may be higher than a concentration of germanium (Ge) in each of the first epitaxial region 152 and the second epitaxial region 154. For example, the shallow doping region SDR may be a region doped with a high concentration of germanium (Ge).

An atomic percentage of germanium (Ge) with respect to silicon (Si) may have a maximum value in the shallow doping region SDR. In a source/drain region 150, the atomic percentage of germanium (Ge) with respect to silicon (Si) may have a maximum value on the upper surface of the source/drain region 150. The maximum value may range from about 95 at % to about 100 at %, for example. In example embodiments, since the shallow doping region SDR may be doped with germanium (Ge) by a chemical reaction on a surface of the source/drain region 150, a high concentration of germanium (Ge) in a range of about 95 at % to about 100 at % on the upper surface of the source/drain region 150 may be included. Since a high concentration of germanium (Ge) may be doped on the surface of the source/drain region 150, contact resistance due to contact between the contact structure 180 and the source/drain region 150 may be reduced.

The concentration of germanium (Ge) in the shallow doping region SDR may gradually decrease from the upper surface of the source/drain region 150 toward the upper surface of the substrate 101 in a direction that is perpendicular to the upper surface of the substrate 101. The atomic percentage of germanium (Ge) with respect to silicon (Si) in the shallow doping region SDR may range from about 50 at % to about 100 at %. In the shallow doping region SDR, the atomic percentage of germanium (Ge) with respect to silicon (Si) may gradually decrease from about 100 at % to about 50 at %, from the upper surface of the source/drain region 150 toward the upper surface of the substrate 101 in a third direction, for example, a Z direction that is perpendicular to the upper surface of the substrate 101.

A depth T of the shallow doping region SDR may range from, for example, about 2 nm to about 6 nm. In example embodiments, the depth T of the shallow doping region SDR may range from about 2 nm to about 4 nm. In the present inventive concept, a depth may be defined as a distance from the upper surface of the source/drain region 150 in a central portion of the source/drain region 150, in a direction that is perpendicular to the upper surface of the substrate 101. When a depth T of the shallow doping region SDR doped with a high concentration of germanium is formed greater than the above range, electrical characteristics of the semiconductor device may be deteriorated, and when formed to be lower than the above range, an effect of reducing contact resistance may be reduced. In embodiments formed using a germanium doping method by a chemical reaction on a surface of the source/drain region 150, the shallow doping region SDR may be formed adjacent to the surface of the source/drain region 150.

In example embodiments, a distance between a lower end of the shallow doping region SDR and the upper surface of the source/drain region 150, of which a doping concentration of germanium (Ge) gradually decreases according to a depth, may range from about 2 nm to about 6 nm. The lower end of the shallow doping region SDR may be defined as a set of points in which a concentration of germanium (Ge) has a minimum value or a reduced value in the shallow doping region SDR or in which a concentration of germanium (Ge) is less than the concentration adjacent an upper end of the shallow doping region SDR.

An atomic percentage of germanium (Ge) on the surface of the source/drain region 150 may be formed close to about 100 at %, to reduce contact resistance with the contact structure 180. Since the atomic percentage of germanium (Ge) may be rapidly reduced according to a depth, to form a lightly doped high-concentration doped region, deterioration of electrical characteristics of the semiconductor device due to doping may be prevented.

The shallow doping region SDR may be a region in which a gradient of a concentration of germanium (Ge) according to a depth of the source/drain region 150 is greater than that of the second epitaxial region 154. The shallow doping region SDR may be a region in which a gradient of a concentration of germanium (Ge) according to a depth of the source/drain region 150 is identical to the first epitaxial region 152 or greater than the first epitaxial region 152.

By removal of germanium (Ge) described below with reference to FIG. 14C, germanium (Ge) may be selectively doped in the shallow doping region SDR. The removal of germanium (Ge) may be performed by flowing a material including chloride ions, for example, HCl together. Since attractive force between silicon (Si) included in the shallow doping region SDR and germanium (Ge) doped in the shallow doping region SDR is greater than an attractive force between a material included in gate spacer layers 164 and a gate capping layer 166 and germanium (Ge), germanium (Ge) may be selectively doped in the shallow doping region SDR. For example, germanium (Ge) may be removed so as not to retain germanium (Ge) in a region other than the source/drain region 150, to effectively dope germanium (Ge) having a high concentration in the shallow doping region SDR.

A maximum thickness of each of the epitaxial regions 152 and 154 in a direction that is perpendicular to the upper surface of the substrate 101, may be greater than a maximum thickness of the shallow doping region SDR in a direction that is perpendicular to the upper surface of the substrate 101. In other words, a thickness of a middle portion of each of the epitaxial regions 152 and 154 may be greater than a thickness of the shallow doping region SDR.

The first epitaxial region 152 may be a region in which a concentration of germanium (Ge) rapidly changes according to a depth of the source/drain region 150 in a direction that is perpendicular to an upper surface of the substrate 101. The first epitaxial region 152 may be a region in which a gradient of a concentration of germanium (Ge) according to a depth of the source/drain region 150 is greater than that of the second epitaxial region 154.

A concentration of germanium (Ge) in the first epitaxial region 152 may decrease from the upper surface of the source/drain region 150 toward the upper surface of the substrate 101 in a direction that is perpendicular to the upper surface of the substrate 101. In some example embodiments, an atomic percentage of germanium (Ge) with respect to silicon (Si) in the first epitaxial region 152 may range from about 1 at % to about 50 at %. The atomic percentage of germanium (Ge) decreases with increasing depth from the upper surface of the source/drain region 150 towards the substrate 101.

The first epitaxial region 152 may be a region including impurities at a higher concentration than the doped region 105D. The impurities may be first impurities included in the doped region 105D. For example, the first epitaxial region 152 may be a SiGe layer including impurities of a first conductivity type such as boron (B). The first epitaxial region 152 may be a layer having an epitaxially grown crystal structure, and may further include a seed layer for growth.

The second epitaxial region 154 may have little or no gradient of a concentration of germanium (Ge) according to a depth of the source/drain region 150 or may be smaller than the first epitaxial region 152 and the shallow doping region SDR.

A concentration of germanium (Ge) in the second epitaxial region 154 may be higher than a concentration of germanium (Ge) in the first epitaxial region 152. A concentration of germanium (Ge) in the second epitaxial region 154 may be lower than a concentration of germanium (Ge) in the shallow doping region SDR. In example embodiments, an atomic percentage of germanium (Ge) with respect to silicon (Si) in the first epitaxial region 152 may range from about 45 at % to about 55 at %.

The second epitaxial region 154 may be an epitaxially grown layer, and thus may have a crystal structure continuously connected to the first epitaxial region 152.

A process of forming the shallow doping region SDR may be performed in situ by an epitaxial growth process of the first epitaxial region 152 and the second epitaxial region 154, but is not limited thereto, and may be also performed ex situ.

The gate structure 160 may be disposed above the active region 105 to intersect the active region 105 and extend in one direction, for example, in the Y direction. Channel regions of transistors may be formed in the active region 105 intersecting the gate structure 160. For example, the "channel region" may be a region including a depletion region of a transistor, and may refer to a region in the active region 105 intersecting the gate structure 160 and adjacent to the gate structure 160. The gate structure 160 may include first and second gate dielectric layers 162 and 163, a gate electrode 165, gate spacer layers 164, and a gate capping layer 166.

The first and second gate dielectric layers 162 and 163 may be disposed between the active region 105 and the gate electrode 165. The first gate dielectric layer 162 may be formed on a lower surface of the gate electrode 165 and a lower surface of the second gate dielectric layer 163, and the second gate dielectric layer 163 may be disposed to cover the lower surface and both lateral surfaces of the gate electrode 165. In example embodiments, any one of the first and second gate dielectric layers 162 and 163 may be omitted. The first and second gate dielectric layers 162 and 163 may include oxide, nitride, and/or a high-k material. The high-k material may refer to a dielectric material having a dielectric constant higher than that of a silicon oxide layer ($SiO_2$). The high-k material include, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 165 may include a conductive material, and may include, for example, a metal nitride such as a titanium nitride film (TiN), a tantalum nitride film (TaN), or a tungsten nitride film (WN), and/or a metal material such as aluminum (Al), tungsten (W), or molybdenum (Mo), or a semiconductor material such as doped polysilicon. The gate electrode 165 may be formed as a multilayer such as two or more layers. The gate electrode 165 may be disposed separately between at least some adjacent transistors according to a configuration of the semiconductor device 100.

The gate spacer layer 164 may be disposed on both lateral surfaces of the gate electrode 165. The gate spacer layer 164 may insulate the source/drain region 150 from the gate electrode 165. The gate spacer layer 164 may have a multilayer structure according to some embodiments. The gate spacer layer 164 may be formed of an oxide, a nitride, or an oxynitride, and in particular, may be formed of a low-k film.

The gate capping layer 166 may be disposed on the gate electrode 165, and a lower surface and lateral surfaces thereof may be surrounded by the gate electrode 165 and the gate spacer layer 164, respectively.

The interlayer insulating layer 190 may be disposed to cover or overlap the source/drain region 150 and the gate structure 160, and may be disposed to cover or overlap the device isolation layer 110 in a region not illustrated. The interlayer insulating layer 190 may include, for example, at least one of an oxide, a nitride, or an oxynitride, and may include a low-k material.

The contact structure 180 may pass through the interlayer insulating layer 190 to be connected to the source/drain region 150, and may apply an electrical signal to the source/drain region 150. The contact structure 180 may be disposed on the source/drain region 150, as illustrated in FIG. 1, and according to some embodiments, the contact structure 180 may be disposed to have a length longer than the source/drain region 150 in the Y direction. The contact structure 180 may have an inclined lateral surface in which a width of a lower portion becomes narrower than a width of an upper portion according to an aspect ratio, but is not limited thereto. The contact structure 180 may be in contact with the upper surface of the source/drain region 150. The contact structure 180 may be in contact with the shallow doping region SDR. In example embodiments, a lower end of the contact structure 180 may be disposed on substantially the same level as an uppermost surface of the source/drain region 150. According to some embodiments, the contact structure 180 may be disposed to recess the source/drain region 150 to a predetermined depth.

The contact structure 180 may include a metal-semiconductor compound layer 182 disposed on the shallow doping region SDR, and a contact plug that includes first and second conductive layers 184 and 185 on the metal-semiconductor compound layer 182.

The metal-semiconductor compound layer 182 may be a metal-germanium alloy layer, a metal-silicon alloy layer, or a metal-silicon-germanium alloy layer. In this case, the metal in the metal-semiconductor compound layer 182 may be Ti, Ta, Ni, or Co.

In example embodiments, the contact structure 180 may include a first conductive layer 184 and a second conductive layer 185. The first conductive layer 184 may cover or overlap lower and lateral surfaces of the second conductive layer 185. The first conductive layer 184 may include, for example, a metal nitride such as TiN, TaN, WN, or the like. The second conductive layer 185 may include, for example, a metal such as W or the like.

Figure 3:
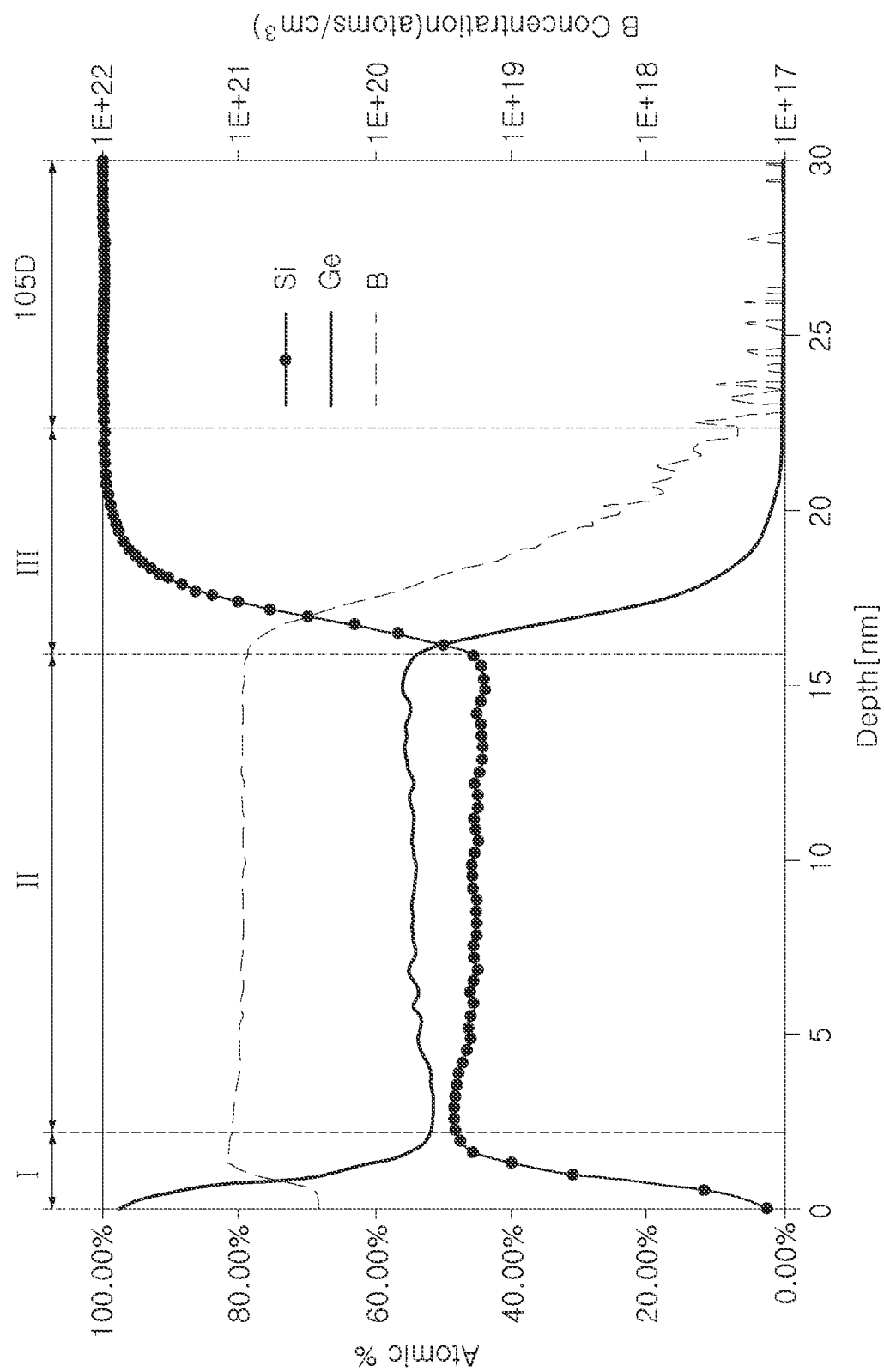
FIG. 3 is a graph illustrating concentrations of germanium, silicon, and a dopant according to a depth from an upper surface of a source/drain region, according to an example of the present inventive concept.

FIG. 3 is a graph illustrating concentrations of germanium, silicon, and a dopant according to a depth from an upper surface of a source/drain region, according to examples of the present inventive concept. FIG. 3 is a graph illustrating a source/drain region of a semiconductor device including a PMOS transistor. FIG. 3 is a graph illustrating a source/drain region doped with germanium (Ge) in a surface of the source/drain region in a chemical reaction of an $H_2$ gas, a $GeH_4$ gas, and/or an HCl gas.

Referring to FIG. 3, a source/drain region of a semiconductor device may include a first region I adjacent to a surface thereof, a second region II disposed below the first region I, and a third region III disposed below the second region II.

The first region I may correspond to the shallow doping region SDR described with reference to FIGS. 1 to 2B. The second region II may correspond to the second epitaxial region 154 described with reference to FIGS. 1 to 2B. The third region III may correspond to the first epitaxial region 152 described with reference to FIGS. 1 to 2B.

It can be seen that an atomic percentage of germanium (Ge) is formed to have about 100 at % in a surface of the first region I.

In the first region I, it can be seen that an atomic percentage of germanium (Ge) with respect to silicon (Si) gradually decreases as a depth increases. In the first region I, a concentration of germanium (Ge) may gradually decrease as a depth from an upper surface of the source/drain region increases. In the first region I, it can be seen that an atomic percentage of germanium (Ge) with respect to silicon (Si) gradually decreases from about 100 at % to about 50 at %.

It can be seen that the first region I is formed in a range of about 2 nm to 3 nm. In embodiments of the present inventive concept, a region in which an atomic percentage of germanium (Ge) decreases as a depth increases may be formed in a shallow region ranging from about 2 nm to about 6 nm.

In the second region II corresponding to a depth of about 3 nm to about 15 nm, it can be seen that an atomic percentage of germanium (Ge) barely changes.

It can be seen that an atomic percentage of germanium (Ge) gradually decreases in the third region III corresponding to a depth of about 15 nm to about 25 nm. A concentration of germanium (Ge) may gradually decrease as a depth from the upper surface of the source/drain region increases in the third region III.

Boron (B) may be doped in the first to third regions I, II, and III, and a doped region 105D.

In example embodiments, boron (B) may be included in a shallow doping region SDR (please refer to FIGS. 2A and 2B) corresponding to the first region I. Since germanium (Ge) is doped in the surface of the source/drain region by a doping process using chemical reaction described in FIGS. 14A to 14C, it can be seen that inclusion of boron (B) in the first region I at the surface of the source/drain region is illustrated in the graph of FIG. 3. For example, boron (B) may be included in a shallow doping region SDR (please refer to FIGS. 2A and 2B) of a semiconductor device that includes a PMOS transistor.

A concentration of boron (B) in the doped region 105D may be lower than a concentration of boron (B) in each of the first to third regions I, II, and III. A concentration of boron (B) in the third region III may decrease as a depth from the upper surface of the source/drain region increases. In example embodiments, a concentration of boron (B) in the third region III may range from about $1\times10^{17}/cm^3$ to about $1\times10^{21}/cm^3$. In example embodiments, a concentration of boron (B) in the third region III may decrease from about $1\times10^{21}/cm^3$ to about $1\times10^{18}/cm^3$ or less. In the second region II, a concentration of boron (B) according to a depth may be almost constant. In example embodiments, a concentration of boron (B) in the second region II may be about $1\times10^{21}/cm^3$.

Figure 4:
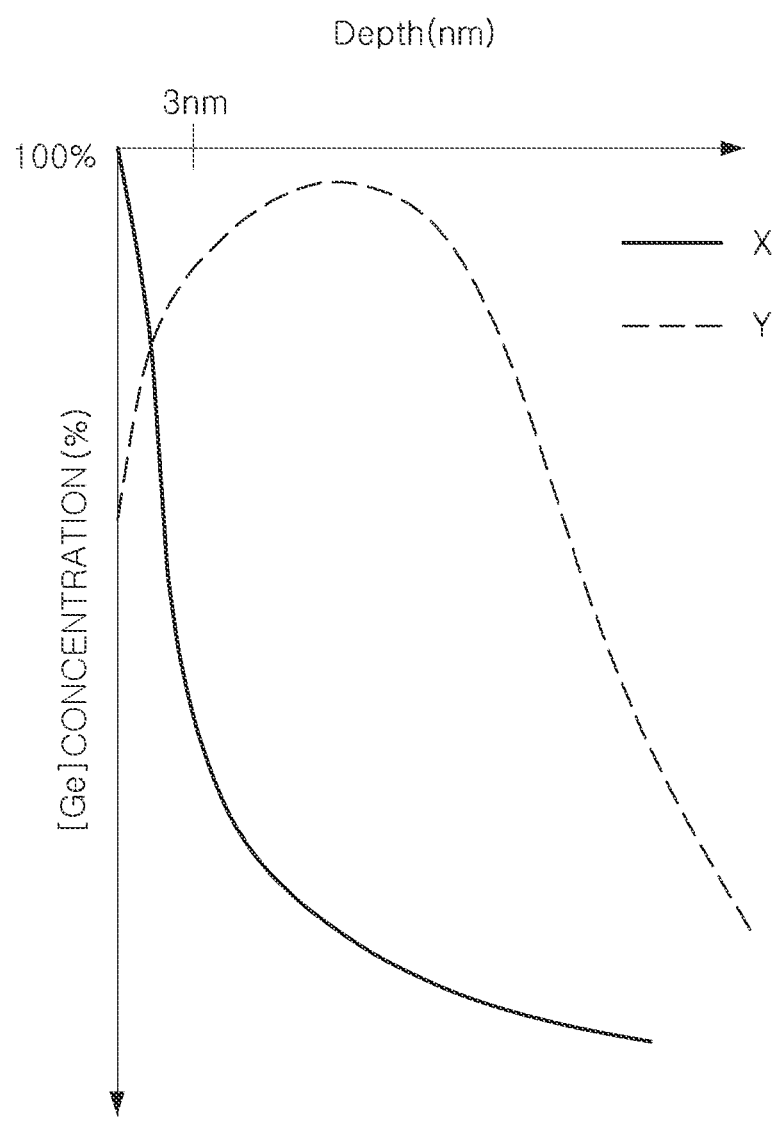
FIG. 4 is a graph schematically illustrating a doping concentration of germanium according to a depth from an upper surface of a source/drain region, in the source/drain region of an example and a comparative example of the present inventive concept.

FIG. 4 is a graph schematically illustrating a doping concentration of germanium according to a depth from an upper surface of a source/drain region, in the source/drain region of an example and a comparative example of the present inventive concept.

In Example (X) of the present inventive concept, germanium (Ge) was doped in a surface of a source/drain region in a chemical reaction of a $H_2$ gas, a $GeH_4$ gas, and a HCl gas. In Comparative Example (Y), germanium (Ge) was doped in a surface of a source/drain region by an ion implantation process.

In Comparative Example (Y) using the ion implantation process, it can be seen that a concentration of germanium (Ge) on the upper surface of the source/drain region does not have a maximum value. In addition, in Comparative Example (Y), it can be seen that, as a depth from the upper surface of the source/drain region increases, a concentration of germanium (Ge) does not gradually decrease, but, as the depth from the upper surface increases, a region in which a concentration increases and a region in which a concentration decreases are included.

In Example (X) of the present inventive concept, a high concentration of germanium (Ge) may be formed within a depth of about 3 nm, to effectively reduce contact resistance with a contact structure disposed above the source/drain region. In Comparative Example (Y), a high concentration of germanium (Ge) was distributed more widely than in Example (X) of the present inventive concept, and an effect of reducing contact resistance may be relatively small because an upper surface thereof does not have a maximum value.

In the following embodiments, the components described with reference to FIGS. 1 to 2B and modified components will be described. Descriptions of components, identical or similar to those described with reference to FIGS. 1 to 2B may be equally applied.

Figure 5:
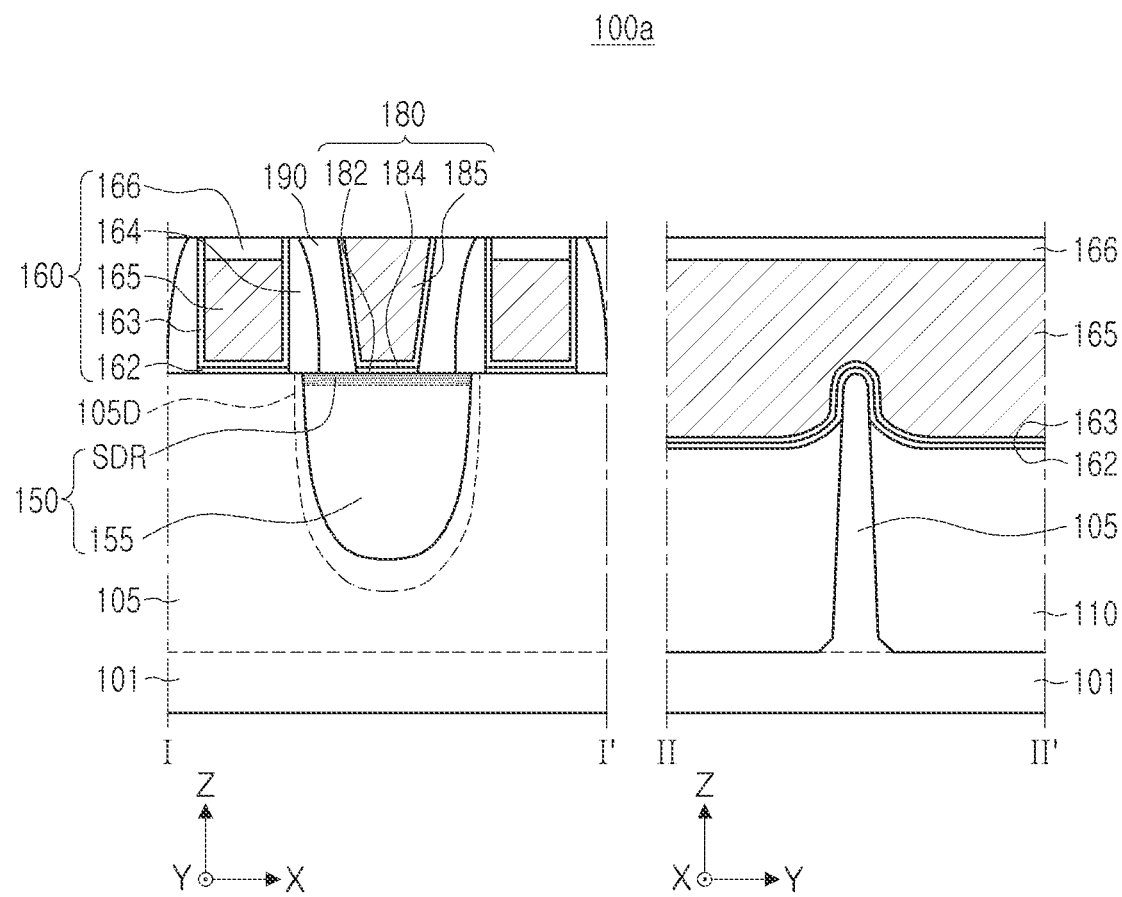
FIG. 5 is a cross-sectional view schematically illustrating a semiconductor device according to some embodiments.

FIG. 5 is a cross-sectional view schematically illustrating a semiconductor device according to some embodiments.

Referring to FIG. 5, a semiconductor device 100a may include FinFET devices, a transistor in which an active region 105 has a fin structure, but is not limited thereto, and may include, for example, a planar transistor. The FinFET devices may include transistors disposed around an active region 105 and a gate structure 160, intersecting each other. For example, the transistors may be NMOS transistors.

The active region 105 may have a doped region 105D including impurities. The doped region 105D may include impurities having the same conductivity type as the source/drain region 150 and a concentration lower than a concentration of the source/drain region 150. According to the described method, the doped region 105D may be interpreted as a portion of the source/drain region 150. For example, the doped region 105D may include second impurities. The second impurities may be, for example, phosphorus (P), arsenic (As), or the like.

The source/drain region 150 may include a third epitaxial region 155 and a shallow doping region SDR disposed on the third epitaxial region 155.

Each of the third epitaxial region 155 and the shallow doping region SDR may include silicon (Si), and may include elements and/or impurities having different concentrations. In example embodiments, the number of epitaxial layers constituting the source/drain region 150 may be variously changed.

The source/drain region 150 may have a second conductivity type, for example, an N-type conductivity. In example embodiments, the source/drain region 150 may include second impurities, identical or similar to the doped region 105D, for example, phosphorus (P), arsenic (As), or the like. In other words, the second impurities in the source/drain region 150 may have the same impurity elements and/or impurities having the same conductivity type as the doped region 105D.

The shallow doping region SDR may be disposed in an upper region including an upper surface of the source/drain region 150.

The shallow doping region SDR may be a region doped with germanium (Ge) by a doping process using a chemical reaction described in FIGS. 14A to 14C in an upper surface of a source/drain region. A concentration of germanium (Ge) in the shallow doping region SDR may be higher than a concentration of germanium (Ge) in third epitaxial region 155. For example, the shallow doping region SDR may be a region doped with a high concentration of germanium (Ge).

The concentration of germanium (Ge) in the shallow doping region SDR may gradually decrease from the upper surface of the source/drain region 150 toward an upper surface of a substrate 101 in a direction that is perpendicular to the upper surface of the substrate 101. An atomic percentage of germanium (Ge) with respect to silicon (Si) in the shallow doping region SDR may range from about 0 at % to about 100 at %. In the shallow doping region SDR, the atomic percentage of germanium (Ge) with respect to the silicon (Si) may gradually decrease from about 100 at % to about 50 at %, from an upper surface of the shallow doping region SDR toward the upper surface of the substrate 101 in a direction that is perpendicular to the upper surface of the substrate 101. In the shallow doping region SDR of the semiconductor device 100a described in this embodiment, a gradient of an atomic percentage of germanium (Ge) according to a depth may be similar to a gradient of the first region I of the semiconductor device 100 described in FIG. 3.

A maximum thickness of the third epitaxial region 155 in a direction that is perpendicular to the upper surface of the substrate 101 may be greater than a maximum thickness of the shallow doping region SDR in a direction that is perpendicular to the upper surface of the substrate 101. In other words, the thickness of a middle portion of the third epitaxial region 155 may be greater than a thickness of the shallow doping region SDR.

In some embodiments, since the third epitaxial region 155 may not contain germanium (Ge), in a similar manner to the first and second epitaxial regions 152 and 154 of FIG. 1, the shallow doping region SDR of the semiconductor device 100a of these embodiments may be formed deeper than the shallow doping region SDR of the semiconductor device 100 of FIG. 1. A depth T of the shallow doping region SDR may range from about 2 nm to about 6 nm. In example embodiments, the depth T of the shallow doping region SDR may range from about 3 nm to about 6 nm.

The shallow doping region SDR may be a region in which a gradient of a concentration of germanium (Ge) is greater than that of the third epitaxial region 155, according to a depth of the source/drain region 150.

The third epitaxial region 155 may barely contain germanium (Ge). An atomic percentage of germanium (Ge) in the third epitaxial region 155 may range from about 0 at % to about 1 at %.

The third epitaxial region 155 may include a plurality of layers having different concentrations of impurities. The third epitaxial region 155 may be a region including impurities at a higher concentration than the doped region 105D. The impurities may be second impurities included in the doped region 105D. The third epitaxial region 155 may be a layer having an epitaxially grown crystal structure, and may further include a seed layer for growth.

A process of forming the shallow doping region SDR may be performed in situ by epitaxial growth process of the third epitaxial region 155, but is not limited thereto, and may be also performed ex situ.

A description of a semiconductor device of FIGS. 6A to 10 described below may also be applied to the semiconductor device of FIGS. 1 to 5.

Figure 6A:
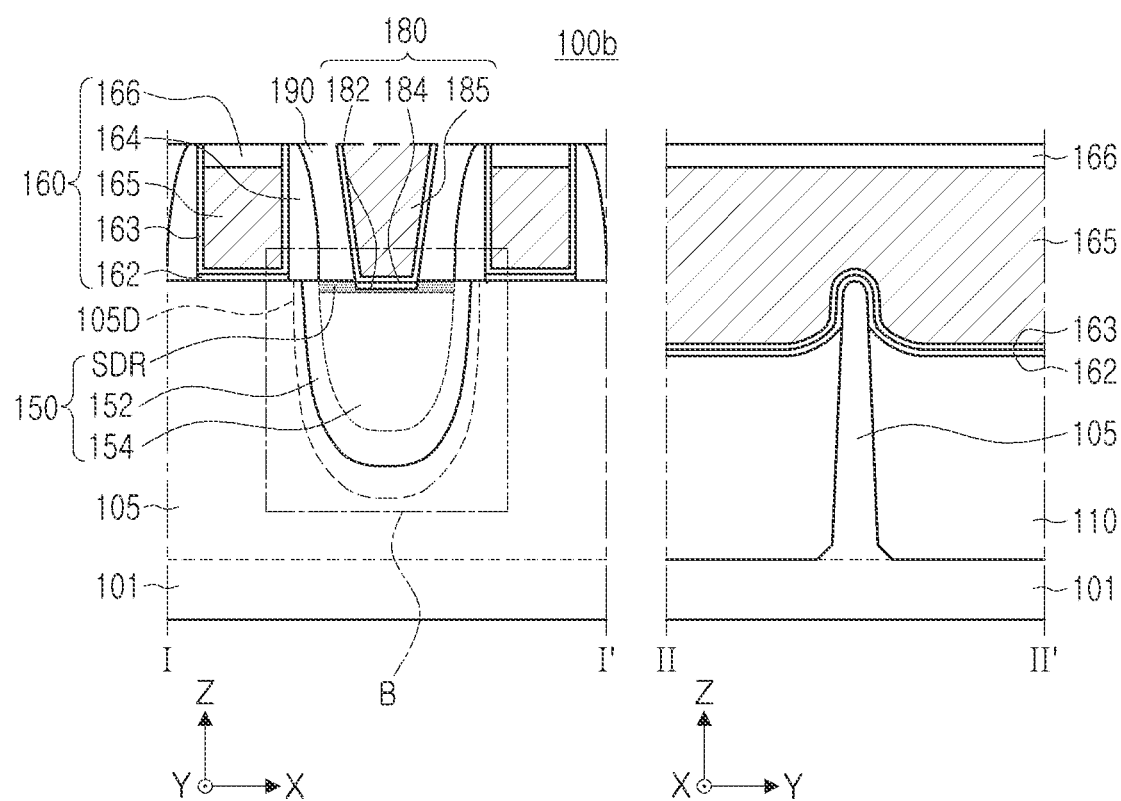
FIG. 6A is a cross-sectional view schematically illustrating a semiconductor device according to some embodiments.
Figure 6B:
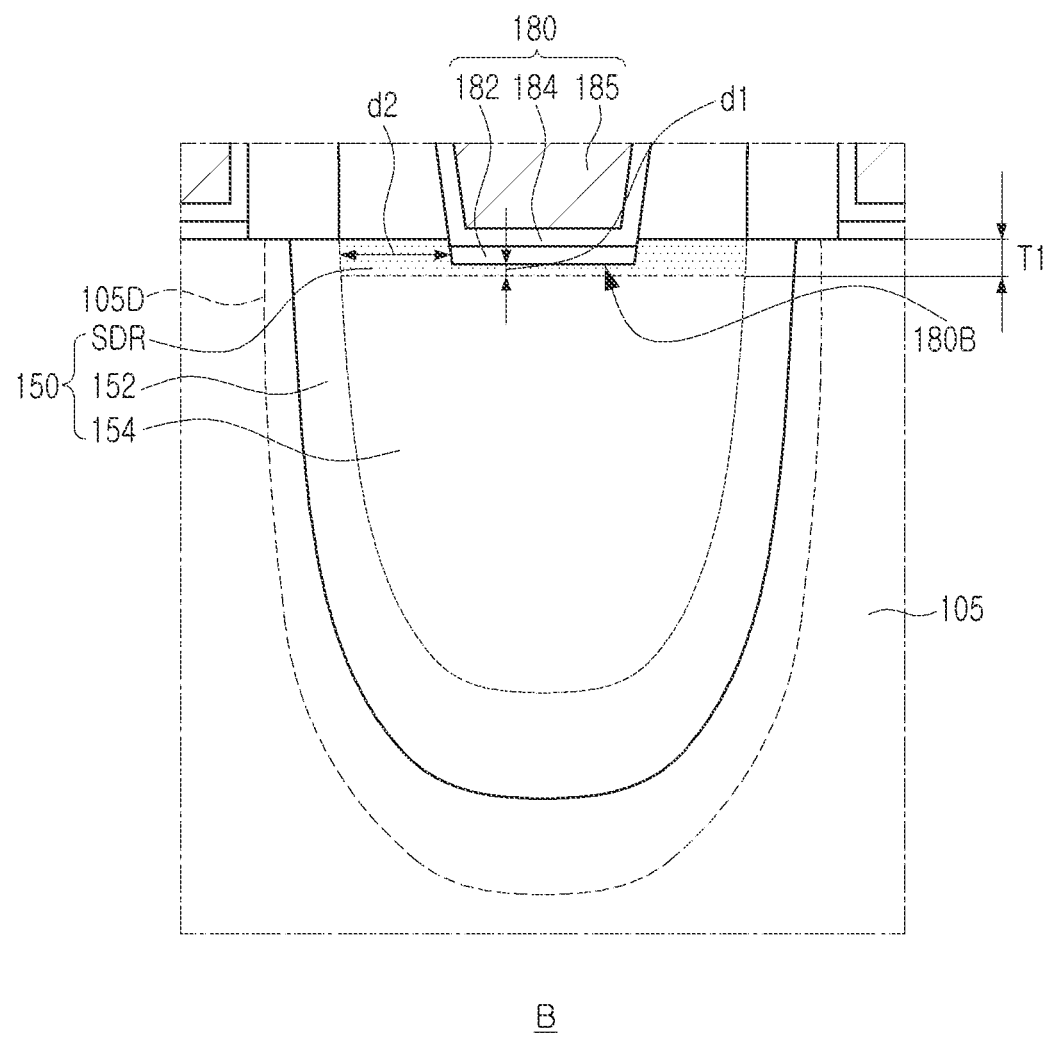
FIG. 6B is a partially enlarged view schematically illustrating a semiconductor device according to some embodiments.

FIG. 6A is a cross-sectional view schematically illustrating a semiconductor device according to some embodiments. FIG. 6B is a partially enlarged view schematically illustrating a semiconductor device according to some embodiments. FIG. 6B may be a cross-sectional view schematically illustrating an enlarged portion 'B' of FIG. 6A.

Referring to FIGS. 6A and 6B, in a semiconductor device 100b, a lower end 180B of a contact structure 180 may be disposed on a level lower than an uppermost surface of a source/drain region 150. The semiconductor device 100b may be formed by a process of forming in situ first and second epitaxial regions 152 and 154 and a shallow doping region SDR, described with reference to FIGS. 12 to 16.

In example embodiments, the lower end of the contact structure 180 may be disposed in the shallow doping region SDR. At least a portion of the lower end and a lateral surface of the contact structure 180 may be surrounded by the shallow doping region SDR in a plan view of the semiconductor device 100b.

At least a portion of the shallow doping region SDR may be recessed. A depth T1 of the shallow doping region SDR from the uppermost surface of the source/drain region 150 may be in a range of, for example, about 2 nm to about 6 nm. Since a contact hole for forming the contact structure 180 may be formed after the shallow doping region SDR is formed, in some embodiments, regardless of an arrangement of the contact structure 180, a lower end of the shallow doping region SDR may be uniformly arranged at substantially the same depth from the uppermost surface of the source/drain region 150. The lower end of the shallow doping region SDR may be defined as a set of points in which a concentration of germanium (Ge) has a minimum value or a reduced value in the shallow doping region SDR. In a region in which the shallow doping region SDR is recessed, and in a region in which the shallow doping region SDR is not recessed, concentrations of germanium (Ge) according to a depth from the uppermost surface of the source/drain region 150 may be the same or similar.

In some example embodiments, a distance d2 of the shallow doping region SDR from the lateral surface of the contact structure 180 to a side end of the shallow doping region in the first direction, for example, the X direction may be greater than a distance d1 of the shallow doping region SDR from the lower end 180B of the contact structure 180 to a lower end of the shallow doping region SDR in the third direction, for example, in the Z direction, but is not limited thereto. In these embodiments, the side end of the shallow doping region SDR may be defined as a set of points in which a concentration of germanium (Ge) changes rapidly at the boundary between the shallow doping region SDR and the other region.

In example embodiments, the lower end of the contact structure 180 may be formed to be deeper than a depth of the shallow doping region SDR, which may be a region in which a concentration of germanium (Ge) gradually decreases, in a different manner to that illustrated in FIG. 6B. In example embodiments, the shallow doping region SDR may be in contact with at least a portion of the lateral surface of the contact structure 180. In this case, contact resistance may be reduced by the lateral surface of the contact structure 180 contacting a region doped with a high concentration of germanium (Ge).

Figure 7:
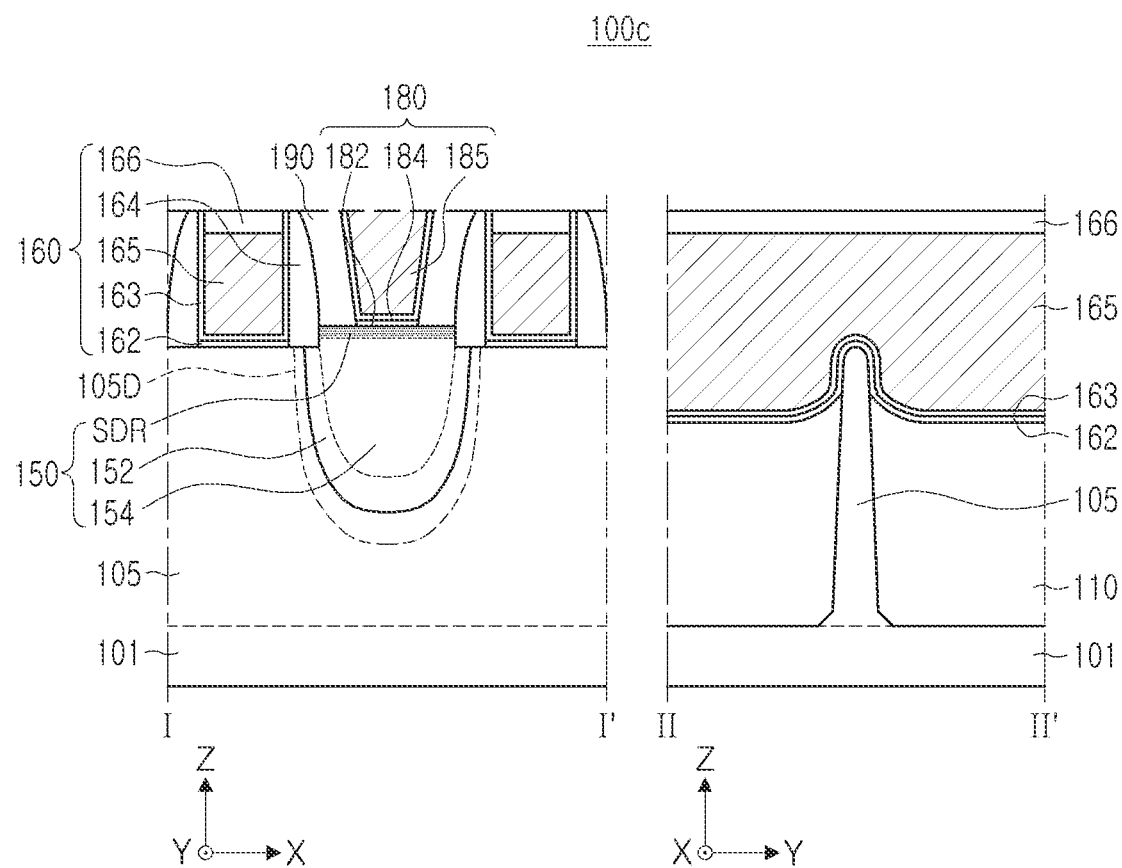
FIG. 7 is a cross-sectional view schematically illustrating a semiconductor device according to some embodiments.

FIG. 7 is a partially enlarged view schematically illustrating a semiconductor device according to some embodiments.

Referring to FIG. 7, in a semiconductor device 100c, an upper surface of the source/drain region 150 may be disposed on a higher level than a lower surface of the gate structure 160. In example embodiments, the source/drain region 150 may have an elevated source/drain shape, in which an upper surface may be higher than a lower surface of a gate electrode 165.

Figure 8A:
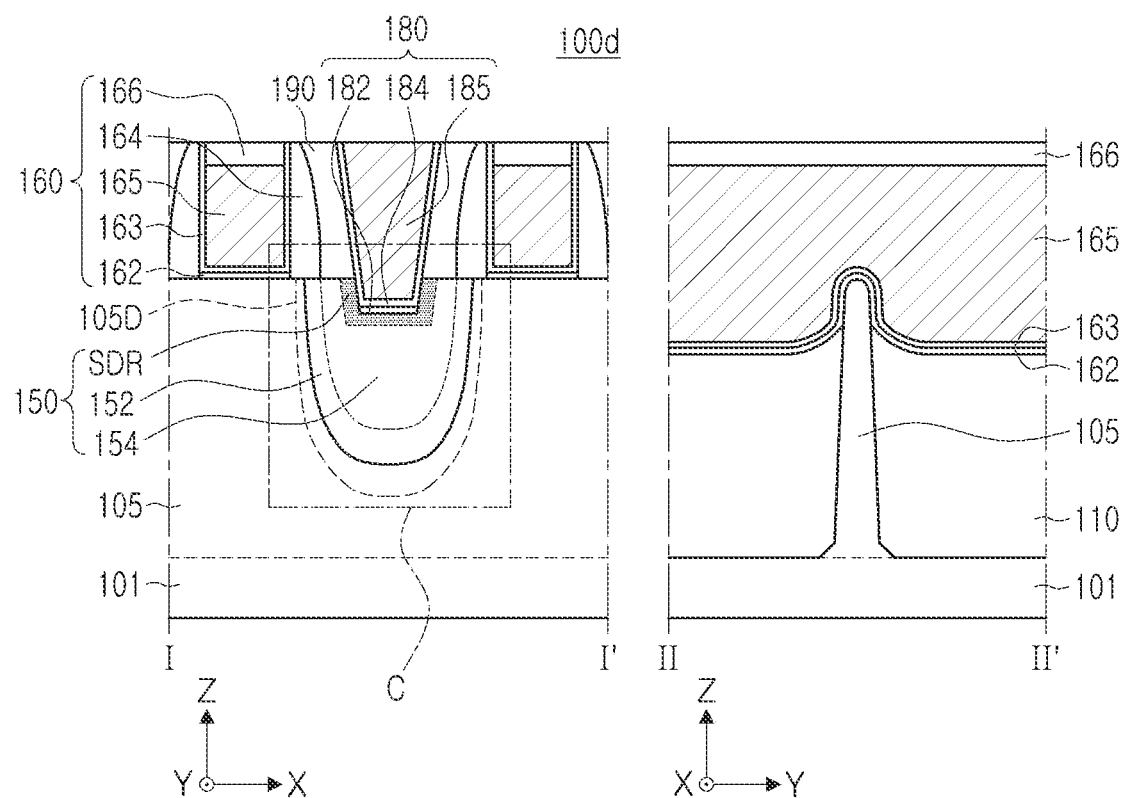
FIG. 8A is a partially enlarged view schematically illustrating a semiconductor device according to some embodiments.
Figure 8B:
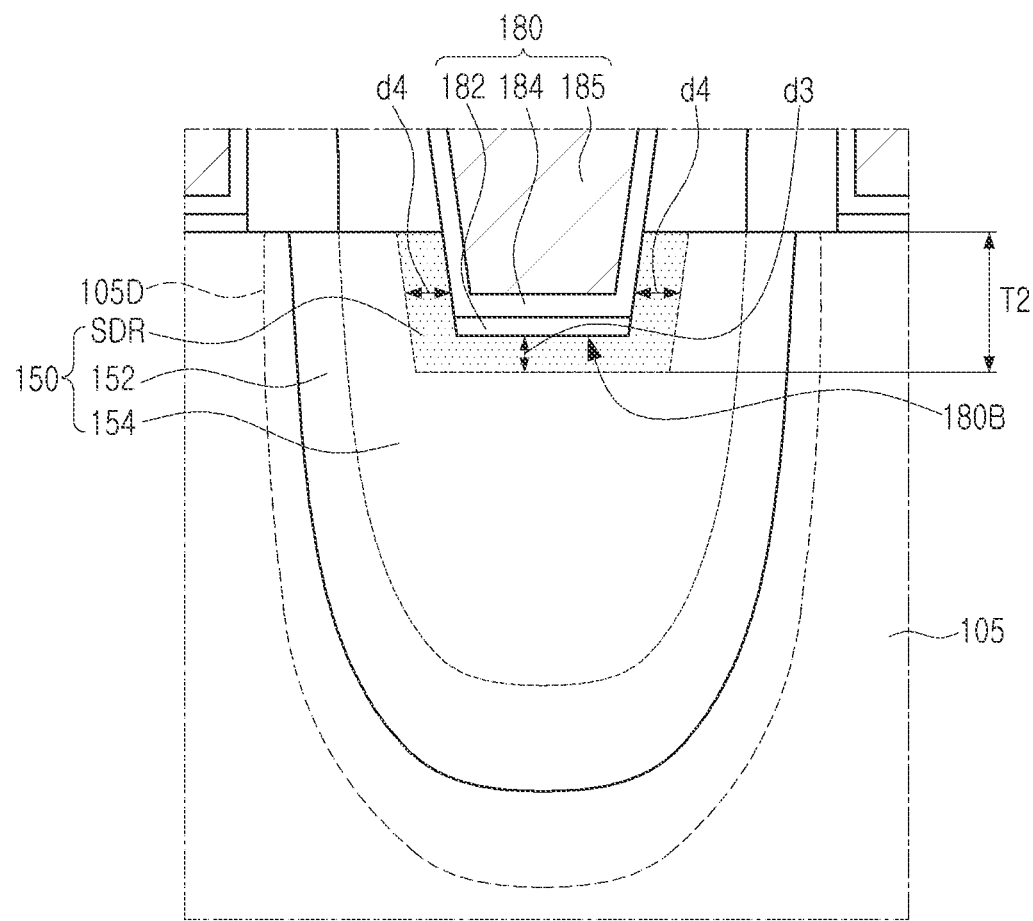
FIG. 8B is a partially enlarged view schematically illustrating a semiconductor device according to some embodiments.

FIG. 8A is a cross-sectional view schematically illustrating a semiconductor device according to some embodiments. FIG. 8B is a partially enlarged view schematically illustrating a semiconductor device according to some embodiments. FIG. 8B may be a cross-sectional view schematically illustrating an enlarged portion "C" of FIG. 8A.

Referring to FIGS. 8A to 8B, in a semiconductor device 100d, a lower end 180B of a contact structure 180 may be disposed on a level lower than an uppermost surface of a source/drain region 150. The semiconductor device 100d may be formed by a process of forming ex situ first and second epitaxial regions 152 and 154 and a shallow doping region SDR, described with reference to FIGS. 17 to 18.

In example embodiments, a surface of the source/drain region 150 may have a portion that is concave toward an upper surface of the substrate 101. In example embodiments, an upper end of the shallow doping region SDR is concave toward the upper surface of the substrate 101.

A depth T2 of the shallow doping region SDR from the uppermost surface of the source/drain region 150 may be formed deeper than that formed by a process of forming in situ.

In a process of forming the shallow doping region SDR described below with reference to FIG. 18, since a germanium doping process may be performed after a contact hole H is formed, in some embodiments, the shallow doping region SDR may be disposed along a surface of a contact structure 180 contacting the source/drain region 150. In some example embodiments, a lower end of the shallow doping region SDR may be disposed to be parallel to the surface of the contact structure 180 contacting the source/drain region 150. The lower end of the shallow doping region SDR may be defined as a set of points in which a concentration of germanium (Ge) has a minimum value or reduced value in the shallow doping region SDR. A distance d3 of the shallow doping region SDR from the lower end 180B of the contact structure 180 to the lower end of the shallow doping region SDR in a direction that is perpendicular to an upper surface of a substrate 101, may range from about 2 nm to about 6 nm, for example. A distance d4 of the shallow doping region SDR from a lateral surface of the contact structure 180 to a side end of the shallow doping region SDR in the first direction, for example, the X direction, may range from, for example, about 2 nm to about 6 nm. In these embodiments, the side end of the shallow doping region SDR may be defined as a set of points in which a concentration of germanium (Ge) has a minimum value or a reduced value in the shallow doping region SDR. The distance d4 of the shallow doping region SDR from the lateral surface of the contact structure 180 to the side end of the shallow doping region SDR may be substantially equal to or less than the distance d3 from the lower end 180B of the contact structure 180 to the lower end of the shallow doping region SDR in the Z direction.

In some example embodiments, at least a portion of a lower end and the lateral surface of the contact structure 180 may be surrounded by the shallow doping region SDR in a plan view.

In some example embodiments, since the epitaxial regions 152 and 154 and the shallow doping region SDR may be formed by the ex situ process, the lower end of the contact structure 180 may not be formed to be deeper than a depth of the shallow doping region SDR. For example, the lower end of the contact structure 180 may be disposed on the shallow doping region SDR, and may be in contact with the shallow doping region SDR.

Figure 9:
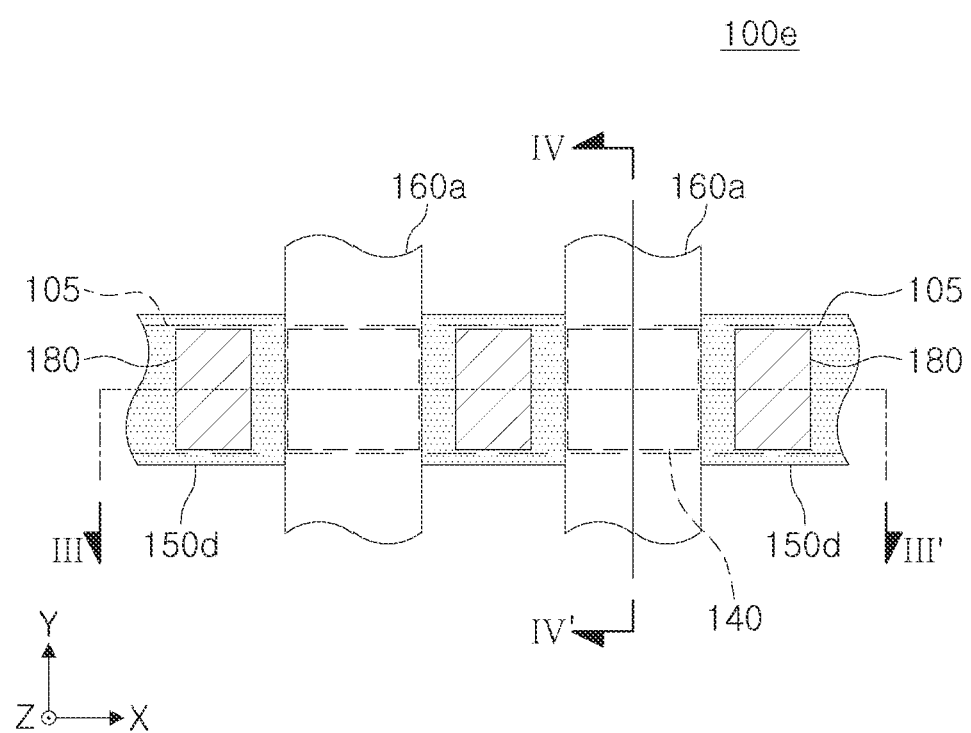
FIG. 9 is a plan view schematically illustrating a semiconductor device according to some embodiments.
Figure 10:
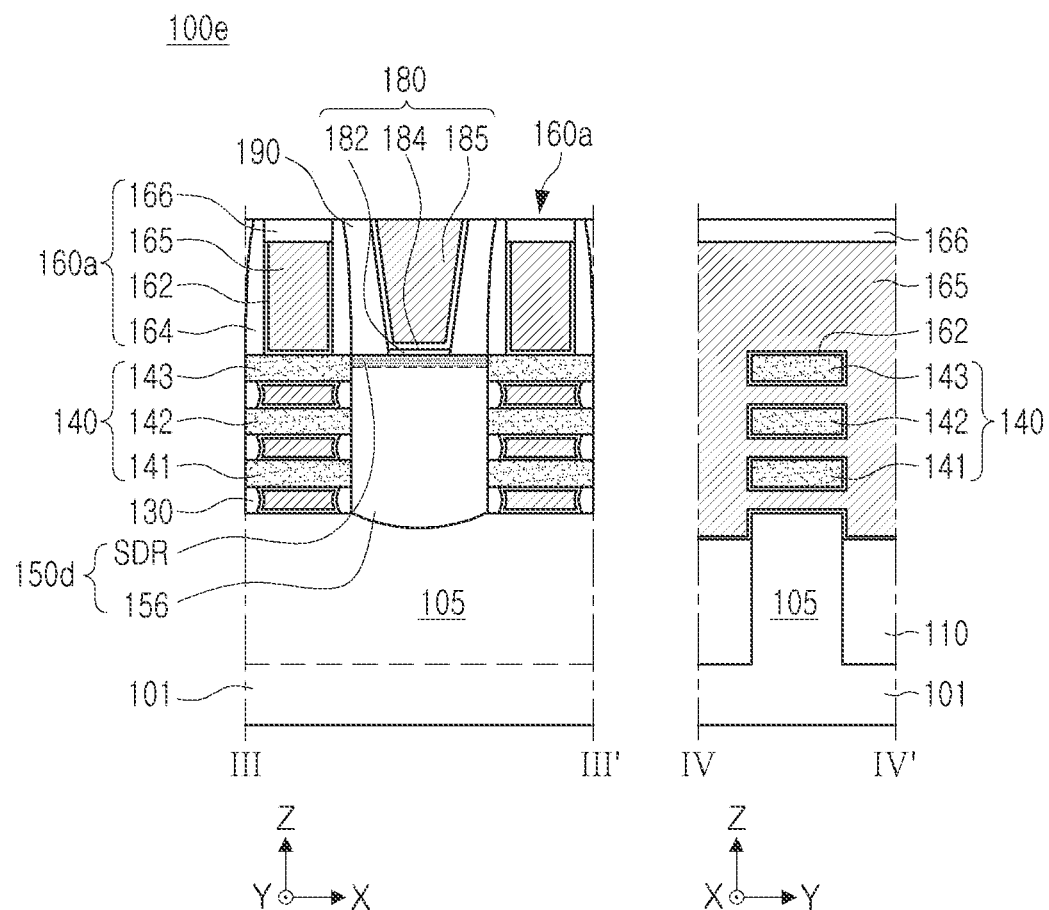
FIG. 10 is a cross-sectional view schematically illustrating a semiconductor device according to some embodiments.

FIG. 9 is a plan view schematically illustrating a semiconductor device according to some embodiments. FIG. 10 is a cross-sectional view schematically illustrating a semiconductor device according to an embodiment. FIG. 10 illustrates cross-sectional views of the semiconductor device of FIG. 9, taken along lines and IV-IV', respectively. For convenience of explanation, major components of a semiconductor device are illustrated in FIGS. 9 and 10.

Referring to FIGS. 9 to 10, a semiconductor device 100e may include a substrate 101, an active region 105 on the substrate 101, a channel structure 140 including a plurality of channel layers 141, 142, and 143 disposed on the active region 105 to be perpendicularly spaced apart from each other, a source/drain region 150d contacting the plurality of channel layers 141, 142, and 143, a gate structure 160a extending to intersect the active region 105, and a contact structure 180 connected to the source/drain region 150d. The semiconductor device 100e may further include a device isolation layer 110, an inner spacer layer 130, and an interlayer insulating layer 190. The gate structure 160a may include a gate dielectric layer 162, a gate electrode 165, gate spacer layers 164, and a gate capping layer 166.

In the semiconductor device 100e, the active region 105 may have a fin structure, and the gate electrode 165 may be disposed between the active region 105 and the channel structure 140 and between the plurality of channel layers 141, 142, and 143 of the channel structure 140. Therefore, the semiconductor device 100e may include a gate-all-around field-effect transistor using the channel structure 140, the source/drain region 150d, and the gate structure 160a. The transistor may be, for example, a PMOS transistor or an NMOS transistor. Hereinafter, the same reference numerals as those of FIGS. 1 to 2B denote corresponding configurations, and descriptions overlapping those described above may be omitted.

The channel structure 140 may include first to third channel layers 141, 142, and 143, two or more of a plurality of channel layers on the active region 105 to be spaced apart from each other, in a direction that is perpendicular to an upper surface of the active region 105, for example, in the Z direction. The first to third channel layers 141, 142, and 143 may be connected to the source/drain region 150d and spaced apart from the upper surface of the active region 105. The first to third channel layers 141, 142, and 143 may have a width, identical or similar to a width of the active region 105, in the Y direction, and may have a width, identical or similar to a width of the gate structure 160a in the X direction. According to some embodiments, the first to third channel layers 141, 142, and 143 may have a reduced width to locate lateral surfaces thereof below the gate structure 160a in the X direction.

The first to third channel layers 141, 142, and 143 may be formed of a semiconductor material, and may include at least one of silicon (Si), silicon germanium (SiGe), or germanium (Ge). The first to third channel layers 141, 142, and 143 may be formed of the same material as the substrate 101, for example. The number and shapes of the channel layers 141, 142, and 143 constituting one (1) channel structure 140 may be variously changed in some embodiments. For example, according to some embodiments, a channel layer may be further located in a region in which the active region 105 is in contact with the gate electrode 165.

The source/drain region 150d may be disposed on the active region 105 on both sides of the channel structure 140. The source/drain region 150d may include an epitaxial layer 156 and a shallow doping region SDR, disposed on a lateral surface of each of the first to third channel layers 141, 142, and 143 of the channel structure 140.

The epitaxial layer 156 may be a semiconductor layer including silicon (Si) and germanium (Ge), or may not include germanium (Ge) in some embodiments. In some example embodiments, the epitaxial layer 156 may include a region in which a gradient in concentration of germanium (Ge) is changed, such as the first epitaxial region 152 and the second epitaxial region 154, described with reference to FIG. 2A. In example embodiments, the epitaxial layer 156 may include a plurality of layers having different concentrations of impurities.

The epitaxial layer 156 may be a region including impurities at a higher concentration than the active region 105. The epitaxial layer 156 may be a layer epitaxially grown from the first to third channel layers 141, 142, and 143, and may be disposed on both sides of the channel structure 140 in the X direction.

The shallow doping region SDR may be disposed in an upper region including an upper surface of the source/drain region 150d.

Germanium (Ge) may be diffused from the upper surface of the source/drain region 150d in an interstitial manner to be disposed in the shallow doping region SDR. A concentration of germanium (Ge) in the shallow doping region SDR may be higher than a concentration of germanium (Ge) in the epitaxial layer 156. For example, the shallow doping region SDR may be a region doped with a high concentration of germanium (Ge).

An atomic percentage of germanium (Ge) with respect to silicon (Si) may have a maximum value in the shallow doping region SDR. The atomic percentage of germanium (Ge) with respect to silicon (Si) may have a maximum value on the upper surface of the source/drain region 150d or have a higher value near the upper surface of the source/drain region 150d compared to a portion adjacent a lower surface of the source/drain region 150d. The maximum value may range from about 95 at % to about 100 at %, for example. In example embodiments, since the shallow doping region SDR may be doped with germanium (Ge) by a chemical reaction on a surface of the source/drain region 150d, a high concentration of germanium (Ge) in a range of about 95 at % to about 100 at % on the upper surface of the source/drain region 150d may be included. Since a high concentration of germanium (Ge) may be doped on the surface of the source/drain region 150d, contact resistance due to contact between the contact structure 180 and the source/drain region 150d may be reduced.

The concentration of germanium (Ge) in the shallow doping region SDR may gradually decrease from the upper surface of the source/drain region 150d in a direction that is perpendicular to an upper surface of the substrate 101.

A depth of the shallow doping region SDR may range from, for example, about 2 nm to about 6 nm.

An atomic percentage of germanium (Ge) on the surface of the source/drain region 150d may be formed close to about 100 at %, to reduce contact resistance with the contact structure 180. Since the atomic percentage of germanium (Ge) may be rapidly reduced according to a depth, to form a lightly doped high-concentration doped region, deterioration of electrical characteristics of the semiconductor device due to doping may be prevented.

The shallow doping region SDR may be a region in which a gradient of a concentration of germanium (Ge) according to a depth of the source/drain region 150d is greater than that of the epitaxial layer 156.

Figure 11:
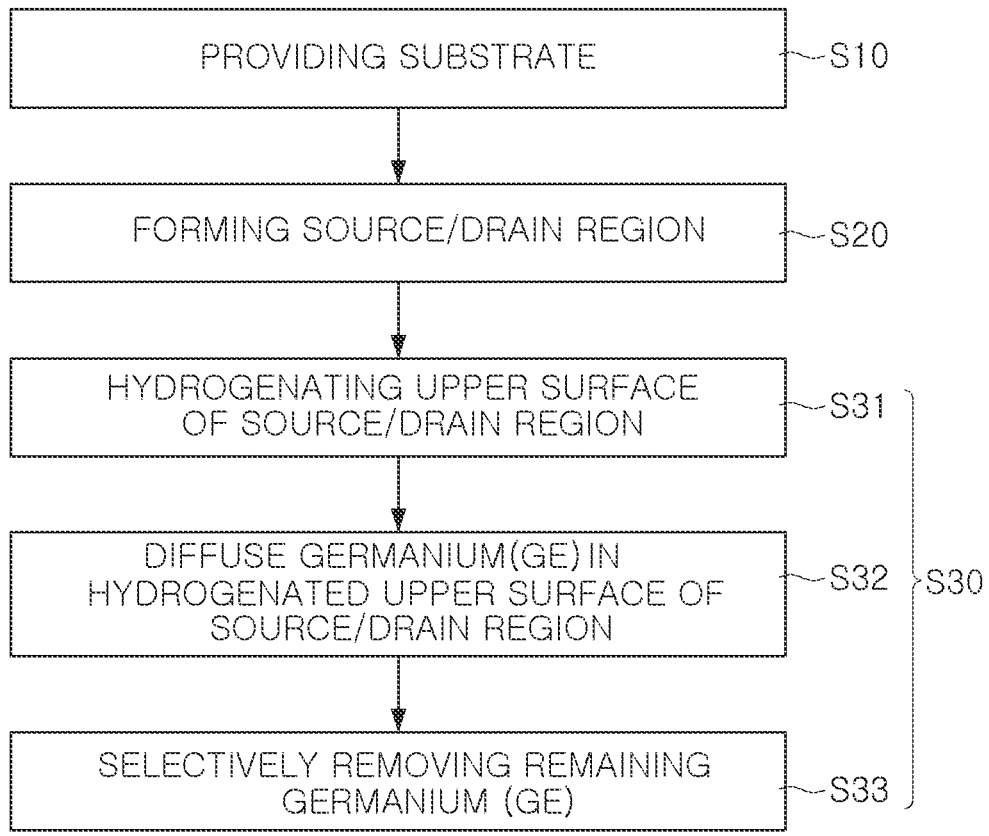
FIG. 11 is a flowchart illustrating a method of manufacturing a semiconductor device according to example embodiments.

FIG. 11 is a flowchart illustrating a method of manufacturing a semiconductor device according to example embodiments. A method of manufacturing a semiconductor device, according to example embodiments, may include providing a substrate (S10), forming a source/drain region on the substrate by epitaxial growth (S20), and doping germanium (Ge) on an upper surface of the source/drain region to gradually decrease a concentration of germanium (Ge) from the upper surface of the source/drain region in a direction that is perpendicular to an upper surface of the substrate (S30).

In particular, the doping germanium (Ge) on an upper surface of the source/drain region (S30) may include hydrogenating the upper surface of the source/drain region (S31), diffusing germanium (Ge) in the hydrogenated upper surface of the source/drain region to dope germanium (Ge) in the hydrogenated upper surface of the source/drain region (S32), and selectively removing a remaining germanium (Ge) in a region other than the source/drain region (S33).

The forming a source/drain region (S20) and the doping germanium (Ge) on an upper surface of the source/drain region (S30) may be formed in situ, but is not limited thereto, and may be formed ex situ.

The S30 of doping germanium (Ge) on an upper surface of the source/drain region may be performed at a temperature ranging from about 400° C. to about 500° C. The S30 of doping germanium (Ge) on an upper surface of the source/drain region may be performed by a CVD apparatus, for example, an RPCVD apparatus, an LPCVD apparatus, or the like.

FIGS. 12 to 16 are views illustrating a method of manufacturing a semiconductor device according to example embodiments.

Figure 12:
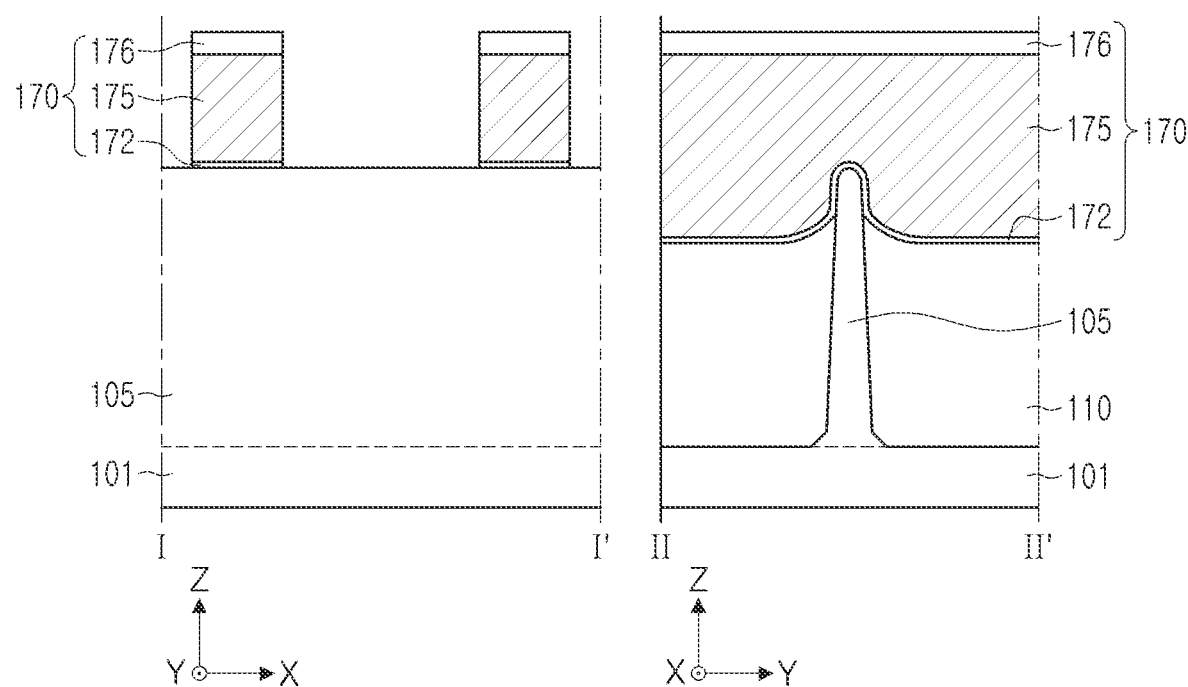
FIG. 12 is a view illustrating a method of manufacturing a semiconductor device according to example embodiments.

Referring to FIG. 12, after patterning a substrate 101 to define an active region 105 and forming a device isolation layer 110, sacrificial gate structures 170 may be formed.

First, an active region 105 may be formed by anisotropically etching a substrate 101 using a mask layer to form trench regions. Since the trench regions have a high aspect ratio, a width of each of the trench regions may become narrower in a downward direction. Therefore, the active region 105 may have a shape that becomes narrower in an upward direction. A device isolation layer 110 may be formed by filling the trench regions with an insulating material and then planarizing the trench regions along an upper surface of the active region 105.

Next, sacrificial gate structures 170 may be formed on the active region 105 to intersect the active region 105, to have a linear shape extending in the Y direction. The sacrificial gate structures 170 may be formed in a region in which first and second gate dielectric layers 162 and 163 and a gate electrode 165 are disposed as illustrated in FIG. 2A in a subsequent process. The sacrificial gate structure 170 may include first and second sacrificial gate layers 172 and 175 and a mask pattern layer 176. The first and second sacrificial gate layers 172 and 175 may be patterned using the mask pattern layer 176.

The first and second sacrificial gate layers 172 and 175 may be an insulating layer and a conductive layer, respectively, but are not limited thereto, and the first and second sacrificial gate layers 172 and 175 may be formed as a single layer. For example, the first sacrificial gate layer 172 may include silicon oxide, and the second sacrificial gate layer 175 may include polysilicon. The mask pattern layer 176 may include silicon oxide and/or silicon nitride. Structures of the sacrificial gate structures 170 may be variously changed in some embodiments.

Figure 13:
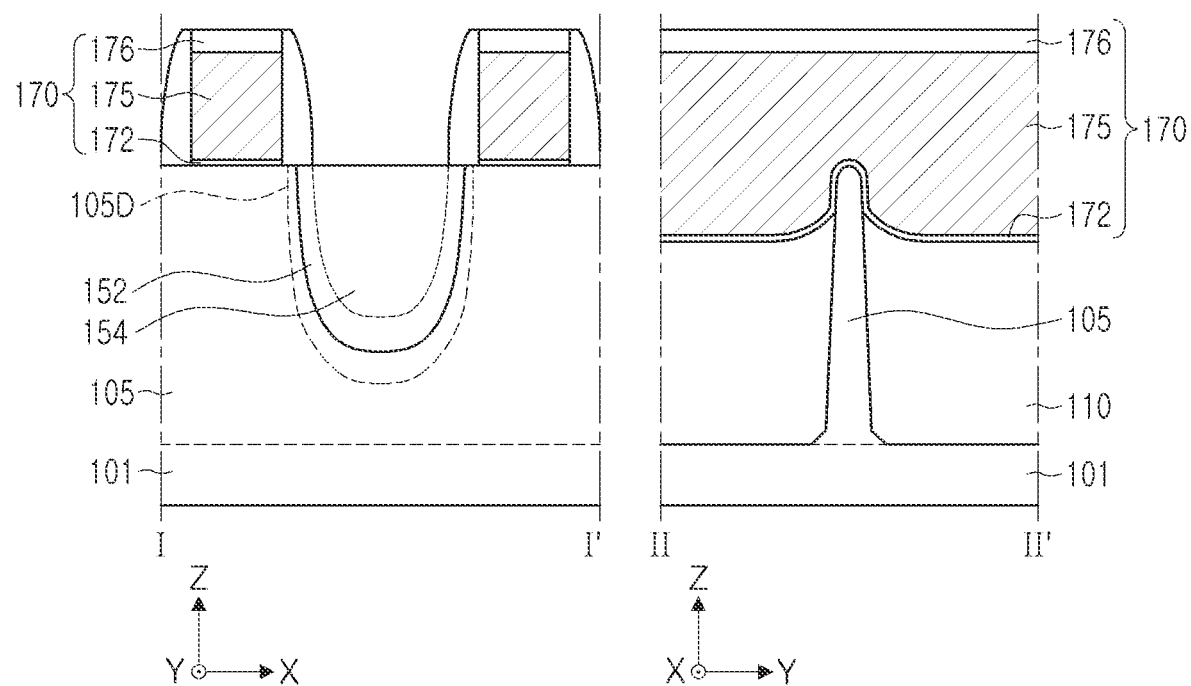
FIG. 13 is a view illustrating a method of manufacturing a semiconductor device according to example embodiments.

Referring to FIG. 13, gate spacer layers 164 may be formed on both sidewalls of the sacrificial gate structures 170, and the active region 105 exposed between the sacrificial gate structures 170 may be recessed to form a recess region. After impurities are implanted into the active region 105 to form a doped region 105D of a source/drain region 150, first and second epitaxial regions 152 and 154 of the source/drain region 150 may be formed.

First, gate spacer layers 164 may be formed on lateral surfaces of the sacrificial gate structures 170. The gate spacer layers 164 may be formed of a low-k material, and may include, for example, at least one of SiO, SiN, SiCN, SiOC, SiON, or SiOCN.

Next, the active region 105 may be recessed from the upper surface thereof to a predetermined depth, to form a recess region.

A doped region 105D may be formed by implanting impurities into the active region 105 using the sacrificial gate structures 170 and the gate spacer layers 164 as masks. The impurities may be boron (B), for example. The doped region 105D may be formed on an upper surface of the exposed active region 105 entirely along lower and lateral surfaces of the recess region.

Next, a first epitaxial region 152 and a second epitaxial region 154 may be formed by growth from the active region 105 using, for example, a selective epitaxial growth (SEG) process. The first epitaxial region 152 and the second epitaxial region 154 may include first impurities by in situ doping. The first epitaxial region 152 and the second epitaxial region 154 may be SiGe layers. A concentration of germanium (Ge) in each of the first and second epitaxial regions 152 and 154 may be higher than a concentration of germanium (Ge) in the doped region 105D. The first epitaxial region 152 may be formed on the doped region 105D entirely along the lower and lateral surfaces of the recess region.

FIGS. 14A to 14C are views illustrating a method of manufacturing a semiconductor device according to example embodiments. FIGS. 14A to 14C illustrate the doping germanium (Ge) on an upper surface of the source/drain region (S30), as illustrated in FIG. 11.

Referring to FIGS. 14A to 14C, a shallow doping region SDR may be formed in an upper region of the source/drain region 150 including an upper surface of the source/drain region 150 including the first and second epitaxial regions 152 and 154.

Germanium (Ge) may be doped in the upper region of the source/drain region 150 at a lower pressure than in a selective epitaxial growth (SEG) process, described in FIG. 13, by a CVD apparatus, for example, RPCVD apparatus. A process of doping germanium (Ge) may be performed at a temperature ranging from about 400° C. to about 500° C.

The process of doping germanium (Ge) may be performed by flowing $H_2$ gas, $GeH_4$ gas, and HCl gas to carry out a chemical reaction of $H_2$ gas, $GeH_4$, and HCl on the source/drain region 150.

First, the hydrogenating (S31) in FIG. 11 may form a dangling bond to lower a surface energy, when the $H_2$ gas flows from the upper surface of the source/drain region 150, as illustrated in FIG. 14B.

The doping germanium (Ge) in the upper surface of the source/drain region in FIG. 11 (S32), as illustrated in FIG. 14B, may include replacing hydrogen with germanium (Ge) (S32a) and interstitially diffusing germanium (Ge) (S32b).

Hydrogen atoms forming the dangling bond on the upper surface of the source/drain region 150 may be replaced with germanium (Ge) atoms by $GeH_4$ (S32a).

Germanium (Ge) atoms may be formed at a high concentration on the upper surface of the source/drain region 150, and the germanium (Ge) atoms formed at a high concentration may be interstitially diffused into the source/drain region 150 (S32b). Therefore, a large number of germanium (Ge) atoms may be included in the upper region including the upper surface of the source/drain region 150 to achieve a high concentration. Therefore, a shallow doping region SDR in which a doping concentration of germanium (Ge) gradually decreases from the upper surface of the source/drain region 150 in a direction that is perpendicular to the substrate 101 may be formed. The shallow doping region SDR may have a depth of about 2 nm to about 6 nm.

In the selectively removing a remaining germanium (Ge) in FIG. 11 (S33), a material including chloride ions, for example, HCl and the like, may flow to remove a remaining germanium (Ge) in a region, other than the upper surface of the source/drain region 150, as illustrated in FIG. 14C.

When the material containing chloride ions flows together with the $H_2$ gas and the $GeH_4$ gas, germanium (Ge) in a region containing a material such as silicon oxide or silicon nitride may be removed at the same time as the hydrogenating (S31) and the doping (S32), mentioned above. For example, a remaining germanium (Ge) on the gate spacer layer 164 and the gate capping layer 166 may be removed by reacting with chloride ions (Cl⁻).

Since attractive force between silicon (Si) and germanium (Ge) included in the source/drain region 150 is greater than attractive force between a material included in the gate spacer layer 164 and the gate capping layer 166, for example, an insulating material such as silicon oxide and silicon nitride and germanium (Ge), germanium (Ge) in the source/drain region 150 may be doped at a high concentration to form a shallow doping region SDR, thereby selectively removing a remaining germanium (Ge). Therefore, germanium (Ge) having a high concentration may be doped only in the upper region of the source/drain region 150 without using a process of forming a separate mask pattern on the gate structure 160.

Figure 15:
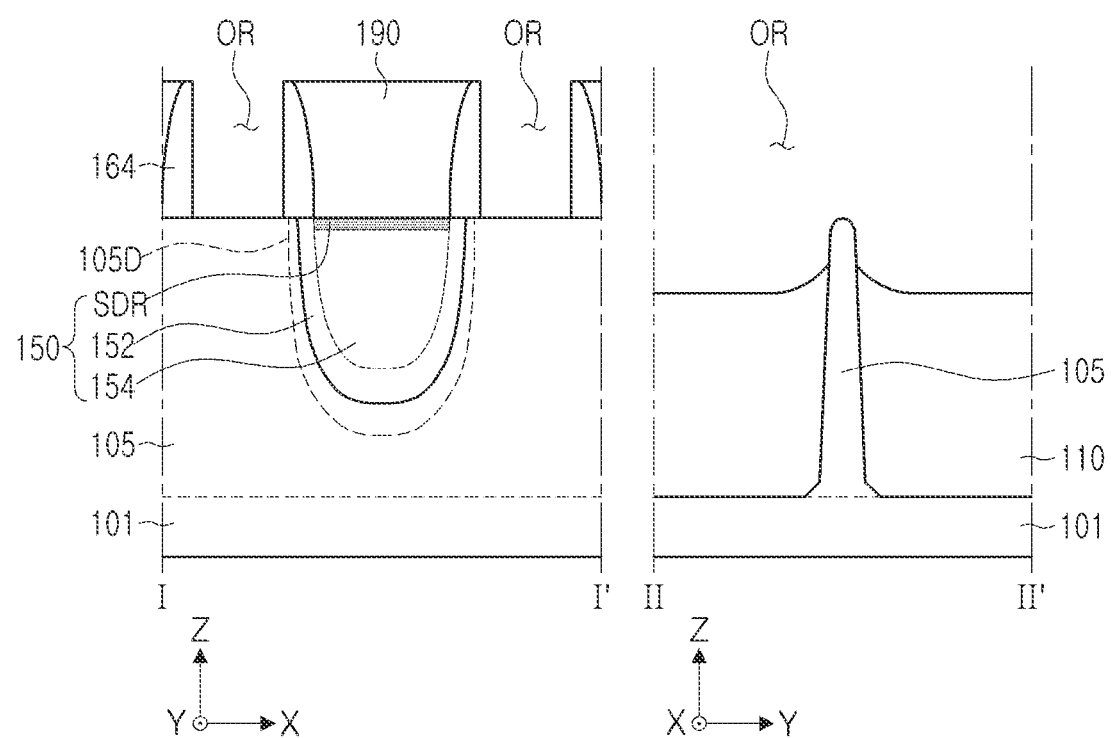
FIG. 15 is a view illustrating a method of manufacturing a semiconductor device according to example embodiments.

Referring to FIG. 15, an interlayer insulating layer 190 may be formed on the source/drain region 150, and the sacrificial gate structures 170 may be removed.

First, an interlayer insulating layer 190 may be formed by depositing an insulating material to cover or overlap the source/drain region 150, the sacrificial gate structures 170, and the gate spacer layer 164, and then performing a planarization process to expose an upper surface of the second sacrificial gate layer 175 or an upper surface of the mask pattern layer 176. According to some embodiments, in the planarization process, the mask pattern layer 176 may be removed. The interlayer insulating layer 190 may include, for example, at least one of an oxide, a nitride, or an oxynitride, and may include a low-k material.

Next, a remaining portion of the sacrificial gate structures 170 including the first and second sacrificial gate layers 172 and 175 may be selectively removed with respect to the active region 105 and the device isolation layer 110 in a lower portion, to form openings OR. At least one of a dry etching process or a wet etching process may be used in the removal of the remaining portion of the sacrificial gate structures 170.

Figure 16:
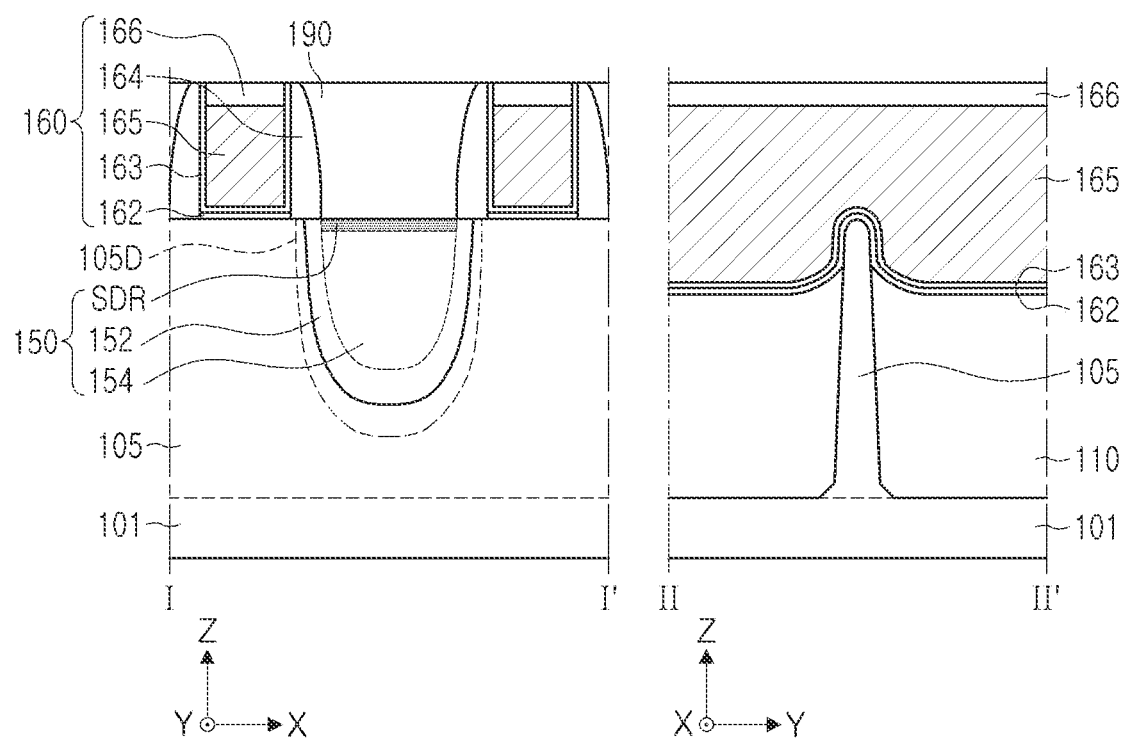
FIG. 16 is a view illustrating a method of manufacturing a semiconductor device according to example embodiments.

Referring to FIG. 16, first and second gate dielectric layers 162 and 163, a gate electrode 165, and a gate capping layer 166 may be formed in the openings OR to finally form a gate structure 160.

First and second gate dielectric layers 162 and 163 may be formed substantially and conformally along sidewalls and lower surfaces of the openings. Each of the first and second gate dielectric layers 162 and 163 may include an oxide, a nitride, or a high-k material. A gate electrode 165 may be formed to at least partially or fully fill inner spaces of the first and second gate dielectric layers 162 and 163. The gate electrode 165 may include a metal or a semiconductor material.

After the first and second gate dielectric layers 162 and 163 and the gate electrode 165 are formed, a planarization process such as a chemical mechanical polishing (CMP) process may be used to remove a material remaining on the interlayer insulating layer 190.

Next, referring to FIG. 2A together, a contact structure 180 may be formed.

First, the interlayer insulating layer 190 may be patterned to form a contact hole, a metal-semiconductor compound layer 182 may be formed on the source/drain region 150, and a contact plug including first and second conductive layers 184 and 185 may be formed by burying a conductive material in the contact hole. The contact hole may be formed by removing the interlayer insulating layer 190 from both sides of the gate structure 160 using a separate mask layer such as a photoresist pattern. A lower surface of the contact hole may have a curvature along the upper surface of the source/drain region 150. In example embodiments, when the interlayer insulating layer 190 is removed, the upper portion of the source/drain region 150 may be partially recessed, but is not limited thereto. As illustrated in FIG. 2A, a lower end of the contact hole may be disposed on the same level as the upper surface of the source/drain region. In example embodiments, a shape and an arrangement of the contact structure 180 may be variously changed. In example embodiments, a lower end of the contact structure 180 may be disposed on the same level as the upper surface of the source/drain region. In example embodiments, the lower end of the contact structure 180 may be disposed on a lower level than the uppermost surface of the source/drain region.

Figure 17:
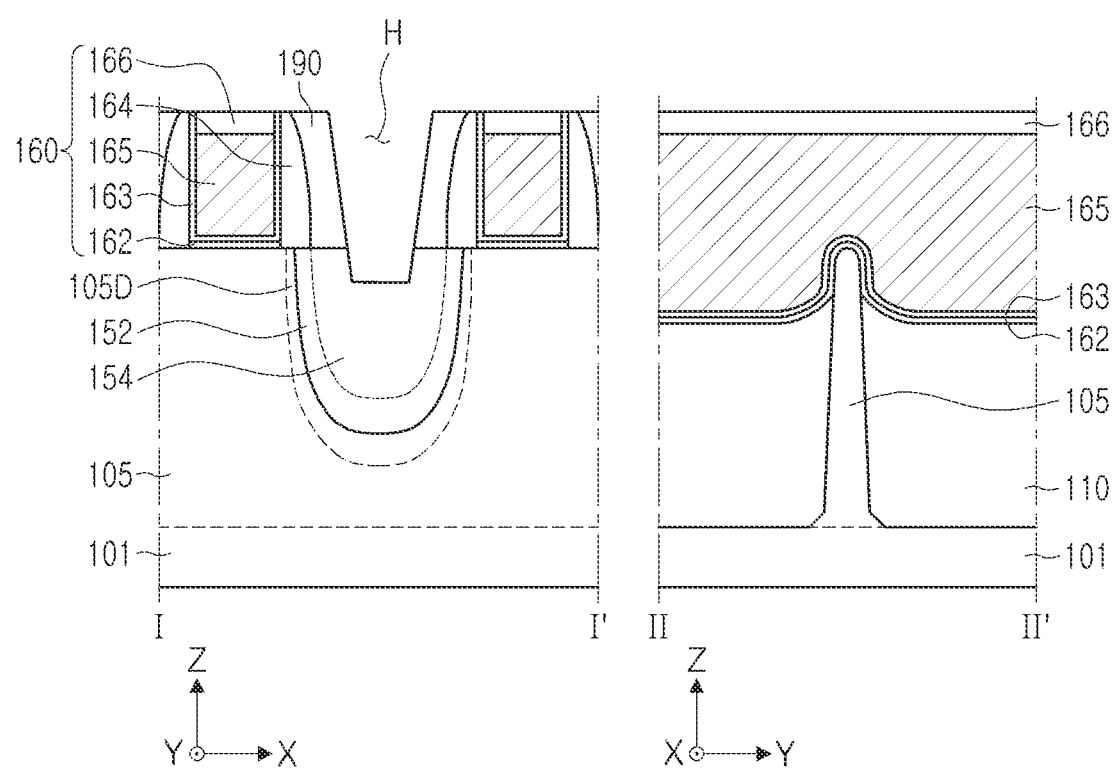
FIG. 17 is a view illustrating a method of manufacturing a semiconductor device according to example embodiments.
Figure 18:
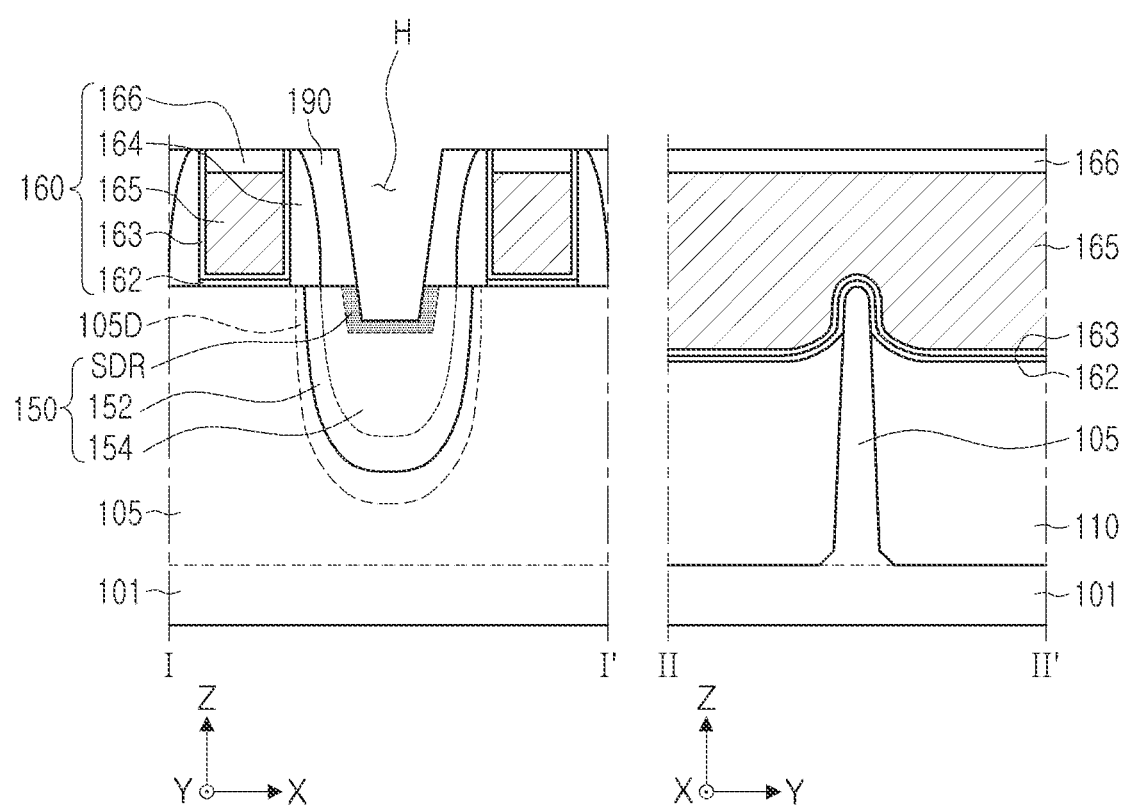
FIG. 18 is a view illustrating a method of manufacturing a semiconductor device according to example embodiments.

FIGS. 17 and 18 are views illustrating a method of manufacturing a semiconductor device according to example embodiments. Referring to FIGS. 17 and 18, unlike those described with reference to FIGS. 14 to 16, epitaxial regions 152 and 154 and a shallow doping region SDR may be formed ex situ.

Referring to FIG. 17, after epitaxial regions 152 and 154 of FIG. 13 are formed, an interlayer insulating layer 190 may be formed on the source/drain region 150 and a sacrificial gate structure 170 may be removed. Next, first and second gate dielectric layers 162 and 163, a gate electrode 165, and a gate capping layer 166 may be formed in a region from which the sacrificial gate structure 170 is removed, to finally form a gate structure 160. Next, the interlayer insulating layer 190 may be patterned to form a contact hole H.

The contact hole H may be formed by removing the interlayer insulating layers 190 from both sides of the gate structure 160 using a separate mask layer such as a pattern. A lower surface of the contact hole may have a curvature along the upper surface of the source/drain region 150. In example embodiments, when the interlayer insulating layer 190 is removed, the upper portion of the source/drain region 150 may be partially recessed, but is not limited thereto. As illustrated in FIG. 2A, a lower end of the contact hole may be disposed on the same level as the upper surface of the source/drain region. In example embodiments, a shape and an arrangement of the contact structure 180 may be variously changed.

Referring to FIG. 18, germanium (Ge) may be doped on the surface of the source/drain region 150 exposed by the contact hole H. As for a germanium (Ge) doping process, the same description as described with reference to FIGS. 14A to 14C may be applied. Since germanium (Ge) may be doped after the contact hole H is formed, when the upper portion of the source/drain region 150 is recessed by the contact hole H as illustrated, a shallow doping region SDR may be formed along the recessed upper portion of the source/drain region 150.

Next, referring to FIG. 2A, a contact structure 180 may be formed. A metal-semiconductor compound layer 182 may be formed on the source/drain region 150, and a conductive material may be buried in the contact hole to form a contact plug including first and second conductive layers 184 and 185.

According to some embodiments of the present inventive concept, a semiconductor device doped with a high concentration of germanium (Ge) in a surface of a source/drain region to minimize contact resistance between the source/drain region and a contact structure may be provided.

According to some embodiments of the present inventive concept, a semiconductor device selectively doped with germanium in a source/drain region in a chemical reaction on a surface of the source/drain region may be provided.

Various advantages and effects of the present inventive concept is not limited to the above description, and can be more easily understood in the process of describing specific embodiments of the present inventive concept.

While embodiments have been illustrated and described above, it will be apparent to those skilled in the art that modifications and variations could be made without departing from the scope of the present inventive concept as defined by the appended claims.

What is claimed is:

1. A semiconductor device comprising:
   an active region on a substrate;
   a gate structure on the substrate, wherein the gate structure intersects the active region;
   a source/drain region on the active region and on a side of the gate structure and comprising silicon (Si); and
   a contact structure on the source/drain region,
   wherein the source/drain region comprises a shallow doping region that is doped with germanium (Ge) and is in an upper region including an uppermost surface of the source/drain region,
   wherein a concentration of germanium (Ge) in the shallow doping region gradually decreases from the upper surface of the source/drain region toward an upper surface of the substrate in a direction that is perpendicular to the upper surface of the substrate, and
   wherein an atomic percentage of germanium (Ge) adjacent the upper surface of the source/drain region is in a range of about 95 at % to about 100 at %.

2. The semiconductor device of claim 1, wherein a depth of the shallow doping region in the direction perpendicular to the upper surface of the substrate is in a range of about 2 nm to about 6 nm.

3. The semiconductor device of claim 1,
   wherein the source/drain region further comprise a first epitaxial region and a second epitaxial region sequentially stacked on the active region,
   wherein the source/drain region has a P-type conductivity,
   wherein each of the first epitaxial region and the second epitaxial region comprises silicon (Si) and germanium (Ge), and
   wherein a concentration of germanium (Ge) in the second epitaxial region is higher than a concentration of germanium (Ge) in the first epitaxial region and is lower than the concentration of germanium (Ge) in the shallow doping region.

4. The semiconductor device of claim 3, wherein, in the shallow doping region, an atomic percentage of germanium (Ge) with respect to silicon (Si) is in a range of about 50 at % to about 100 at %.

5. The semiconductor device of claim 4, wherein, in the shallow doping region, the atomic percentage of germanium (Ge) with respect to silicon (Si) gradually decreases from about 100 at % adjacent the upper surface of the source/drain region to about 50 at %, in the direction towards the upper surface of the substrate.

6. The semiconductor device of claim 1,
   wherein the source/drain region further comprises a third epitaxial region,
   wherein the source/drain region has an N-type conductivity, and
   wherein the third epitaxial region comprises silicon (Si).

7. The semiconductor device of claim 6, wherein an atomic percentage of germanium (Ge) doped in the shallow doping region with respect to silicon (Si) included in the shallow doping region gradually decreases from about 100 at % adjacent the upper surface of the source/drain region to less than about 1 at %, in the direction towards the upper surface of the substrate.

8. The semiconductor device of claim 1,
   wherein the contact structure comprises a metal-semiconductor compound layer on the shallow doping region and a contact plug on the metal-semiconductor compound layer, and
   wherein an upper end of the shallow doping region is recessed toward the upper surface of the substrate.

9. The semiconductor device of claim 1, wherein a distance from a lateral surface of the contact structure to a side end of the shallow doping region is substantially equal to or less than a distance from a lower end of the contact structure to a lower end of the shallow doping region.

10. The semiconductor device of claim 1, wherein a depth of the shallow doping region from the uppermost surface of the source/drain region is in a range of about 2 nm to about 6 nm.

11. The semiconductor device of claim 10, wherein a distance from a lateral surface of the contact structure to a side end of the shallow doping region is greater than a distance from a lower end of the contact structure to a lower end of the shallow doping region.

12. The semiconductor device of claim 1, further comprising:
    a channel layer that extends perpendicular to the upper surface of the substrate on the active region,
    wherein the gate structure overlaps an upper surface and a lateral surface of the channel layer.

13. The semiconductor device of claim 1, further comprising:
    a plurality of channel layers spaced apart from each other perpendicular to the upper surface of the substrate on the active region,
    wherein the gate structure surrounds the plurality of channel layers in a plan view of the semiconductor device.

14. A semiconductor device comprising:
    an active region on a substrate, wherein the active region extends in a first direction;
    a gate structure on the substrate, intersecting the active region, and extending in a second direction; and
    a source/drain region on the active region and on a side of the gate structure and comprising silicon (Si),
    wherein the source/drain region comprises a shallow doping region doped with germanium (Ge) and in an upper region that includes an upper surface of the source/drain region, and an epitaxial region below the shallow doping region,
    wherein a thickness of the epitaxial region in a third direction that is perpendicular to an upper surface of the substrate is greater than a thickness of the shallow doping region in the third direction, and
    wherein an atomic percentage of germanium (Ge) with respect to silicon (Si) adjacent the upper surface of the source/drain region is in a range of about 95 at % to about 100 at %.

15. The semiconductor device of claim 14, wherein a concentration of germanium (Ge) doped in the shallow doping region gradually decreases from the upper surface of the source/drain region toward the upper surface of the substrate in the third direction.

16. The semiconductor device of claim 14, wherein a depth of the shallow doping region is in a range of about 2 nm to about 6 nm.

17. A semiconductor device comprising:
an active region on a substrate;
a gate structure on the substrate, wherein the gate structure intersects the active region; and
a source/drain region on the active region on at least one side of the gate structure,
wherein the source/drain region comprises a first region having a depth of about 2 nm to about 6 nm from an upper surface of the source/drain region,
wherein, in the first region, a concentration of germanium (Ge) in the source/drain region gradually decreases as a depth of the source/drain region from the upper surface of the source/drain region increases, and
wherein an atomic percentage of germanium (Ge) adjacent the upper surface of the source/drain region is in a range of about 95 at % to about 100 at %.

18. The semiconductor device of claim 17, wherein the source/drain region further comprises:
a second region below the first region and including silicon (Si) and germanium (Ge); and
a third region below the second region and including silicon (Si) and germanium (Ge),
wherein, in the third region, a concentration of germanium (Ge) gradually decreases as a depth of the source/drain region from the upper surface of the source/drain region increases.

19. The semiconductor device of claim 1, wherein a lower end of the contact structure is on substantially a same level as the upper surface of the source/drain region.

20. The semiconductor device of claim 1, wherein a lower end of the contact structure is closer than the uppermost surface of the source/drain region to the substrate.

* * * * *